(12) United States Patent
Saito

(10) Patent No.: US 9,660,014 B2
(45) Date of Patent: May 23, 2017

(54) SEMICONDUCTOR DEVICE

(71) Applicant: Fuji Electric Co., Ltd., Kanagawa (JP)

(72) Inventor: Masaru Saito, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/016,113

(22) Filed: Feb. 4, 2016

(65) Prior Publication Data

US 2016/0276425 A1    Sep. 22, 2016

(30) Foreign Application Priority Data

Mar. 20, 2015  (JP) ................................. 2015-057149

(51) Int. Cl.
| | |
|---|---|
| *H01L 27/06* | (2006.01) |
| *H01L 23/52* | (2006.01) |
| *H01L 49/02* | (2006.01) |
| *H01L 23/522* | (2006.01) |

(52) U.S. Cl.
CPC .......... *H01L 28/20* (2013.01); *H01L 23/5228* (2013.01); *H01L 27/0629* (2013.01)

(58) Field of Classification Search
CPC ..... H01L 29/80; H01L 23/52; H01L 23/5228; H01L 27/06; H01L 27/0629; H01L 28/20
See application file for complete search history.

(56) References Cited

U.S. PATENT DOCUMENTS

| | | | | |
|---|---|---|---|---|
| 2001/0048122 | A1* | 12/2001 | Tada | H01L 29/402 257/240 |
| 2002/0096739 | A1* | 7/2002 | Takasu | H01L 27/0802 257/538 |
| 2008/0117653 | A1* | 5/2008 | Saito | H01L 29/405 363/20 |
| 2012/0154026 | A1* | 6/2012 | Karino | H01L 27/0629 327/543 |
| 2014/0184381 | A1* | 7/2014 | Hao | H01C 17/06 338/306 |
| 2016/0104724 | A1* | 4/2016 | Saito | H03K 17/687 327/109 |

FOREIGN PATENT DOCUMENTS

JP    2008-153636 A    7/2008

* cited by examiner

*Primary Examiner* — Fazli Erdem
(74) *Attorney, Agent, or Firm* — Chen Yoshimura LLP

(57) ABSTRACT

A semiconductor device includes: a semiconductor substrate; and a thin film resistor formed over an upper surface of the semiconductor substrate, the thin film resistor including first thin film resistor units and second thin film resistor units alternately connected in series, each of the first thin film resistor units having an elongated main portion and end portions that are connected to the elongated main portion, the end portions each forming a U-shape together with the elongated main portion in a plan view, and respectively overlapping with two of the second thin film resistor units that are adjacent to and connected to the first thin film resistor unit in series.

9 Claims, 19 Drawing Sheets

SEMICONDUCTOR DEVICE

BACKGROUND OF THE INVENTION

Technical Field

The present invention relates to a semiconductor device, and in particular, relates to a technique that can be effectively applied to a semiconductor device having a thin film resistive element provided on an active element, with an insulating film therebetween.

Background Art

As a semiconductor device, switching power supply control ICs that control individual high breakdown voltage switching transistors, for example, are known. When such ICs are in an operational state, they form their own power supply by operating the high breakdown voltage switching transistor, but when the ICs are started up, it is necessary to provide a startup current from a startup circuit. Generally, startup circuits are integrated on the same semiconductor substrate as the switching power supply control IC, and as a result, the number of parts is reduced and the power supply system is simplified.

The startup current is attained by rectifying an inputted alternating current (AC) signal of 100 to 240V, and in order to feed this current to the startup circuit, it is necessary for the breakdown voltage of a normally-on element located upstream from the startup circuit to be 450V or greater. A lateral junction field effect transistor (JFET) with a high breakdown voltage is realized as a normally-on element in order for the normally-on element to be monolithically formed with the switching power supply control IC. The design specifications of the switching power supply device are decided according to the current driving performance of this element.

When the switching power supply device is unplugged from the outlet and stops receiving voltage supply from the AC input, then the primary side input voltage drops. If the switching power supply device continues to operate in this state, the ON time of the switching MOSFET becomes longer, which results in heat being generated therein. In order to prevent this problem, switching power supply devices are provided with a brownout function to stop the switching operation of the power supply when the input voltage is reduced.

The methods to realize this brownout function can be generally categorized into an external resistance dividing scheme and an IC chip embedding scheme. In the IC chip embedding scheme, high breakdown voltage dividing resistors are configured according to a voltage-withstanding structure of a high breakdown voltage device (startup element).

When embedding inside the IC chip, the voltage-withstanding structure of the already-existing startup element, which is the high breakdown voltage device, is used, and a spiral-shaped thin film resistor is built into a part of the structure. The thin film resistor is arranged in a spiral shape such that the potential gradually decreases along the periphery from the drain terminal disposed in the center of the startup element, which has the highest potential. The resistor is formed up to the source and gate regions, which are arranged so as to surround the drain region. Therefore, by being integrated with the startup element, it is possible to embed the resistor having the high breakdown voltage without providing a new voltage-withstanding structure (see Patent Document 1, for example).

When using a resistor voltage divider for input voltage detection, however, current is always consumed in the resistor voltage divider while input voltage is being applied. This is an issue that occurs regardless of whether or not the resistor voltage divider is embedded in the semiconductor integrated circuit, and it is normally possible to reduce power consumption by increasing the resistance of the entire resistor voltage divider.

However, when embedding this resistor voltage divider into an integrated circuit, the following two problems occur when increasing resistance.

The first is that, while it is possible to simply increase the number of times the thin film resistor is wound to increase the length thereof in order to increase the resistance, as the number of times the thin film resistor is wound increases, the plan view size thereof increases, and the area of the startup terminal is enlarged in order to accommodate the length of the thin film resistor. This enlargement of the startup element leads to an enlargement of the semiconductor chip, and therefore an enlargement of the semiconductor device. This results in a reduction in the number of chips that can be formed from one semiconductor wafer, which increases cost. The second problem is an increase in resistance variation as a result of dilution of impurity dosage in order to increase the resistance per unit length. One method to solve the second problem is to add an adjustable circuit such as a trimmer, but this results in a more complex circuit structure.

Thus, the inventors of the present invention focused on the leading out of the thin film resistor to arrive at the present invention. Accordingly, the present invention is directed to a scheme that substantially obviates one or more of the above-discussed and other problems due to limitations and disadvantages of the related art.

RELATED ART DOCUMENT

Patent Document

Patent Document 1: Japanese Patent Application Laid-Open Publication No. 2008-153636.

SUMMARY OF THE INVENTION

An object of the present invention is to provide a semiconductor device by which it is possible to increase the resistance of a thin film resistor while mitigating an increase in chip size.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, including: a semiconductor substrate; and a thin film resistor formed over an upper surface of the semiconductor substrate, the thin film resistor including first thin film resistor units and second thin film resistor units alternately connected in series, each of the first thin film resistor units having an elongated main portion and end portions that are connected to the elongated main portion, the end portions each forming a U-shape together with the elongated main portion in a plan view, and respectively overlapping with two of the second thin film resistor units that are adjacent to and connected to the first thin film resistor unit in series.

The above aspect of the present invention, other objects thereof, and new characteristics are made clear by the description in the specification and the attached drawings.

According to the present invention, it is possible to provide a semiconductor device by which the resistance of the thin film resistor is increased while mitigating an increase in chip size.

It is to be understood that both the foregoing general description and the following detailed description are exemplary and explanatory, and are intended to provide further explanation of the invention as claimed.

DETAILED DESCRIPTION OF EMBODIMENTS

Figure 1:
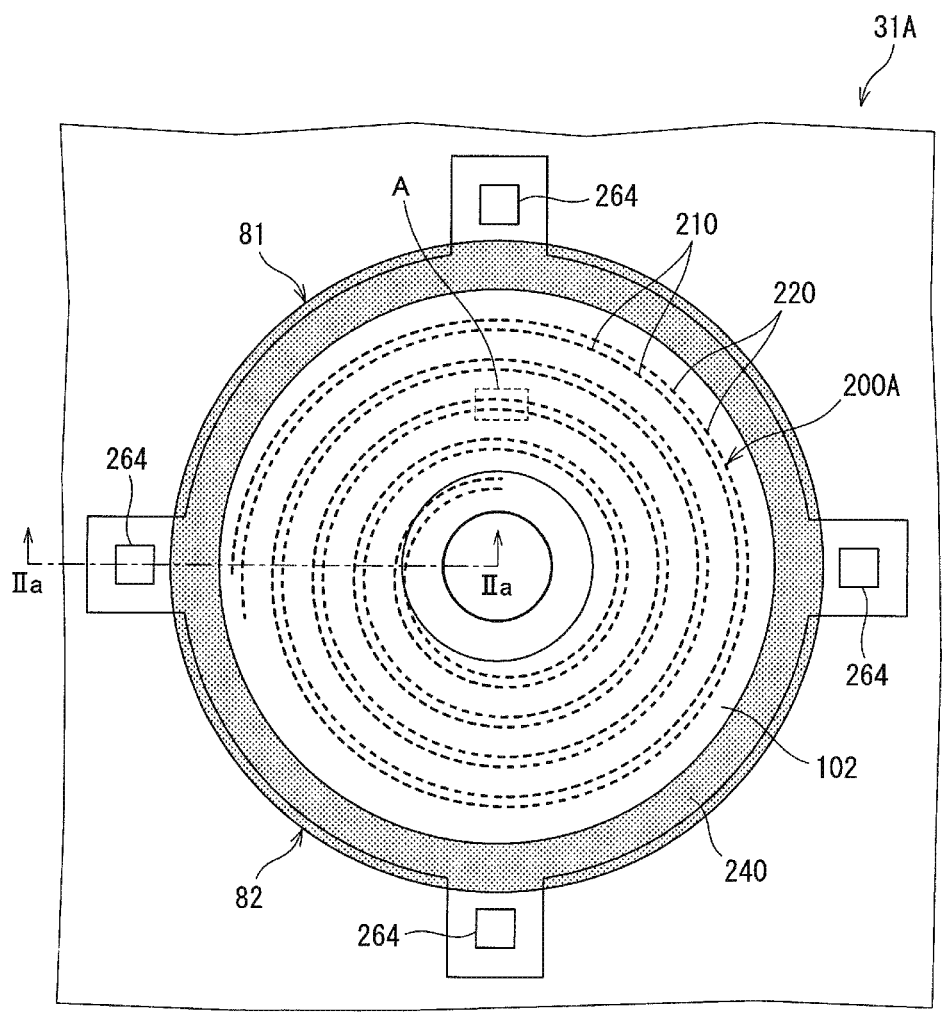
FIG. 1 is a plan view of main components showing a schematic configuration of a semiconductor device of Embodiment 1 of the present invention.

A semiconductor device of embodiments of the present invention will be described below with reference to drawings.

In the present specification, a "first primary electrode region" refers to either the source region or the drain region of a field effect transistor (FET) or a static induction transistor (SIT). In an IGBT, the "first primary electrode region" refers to either the emitter region or the collector region; and in a static inductive thyristor (SI thyristor), a gate turn-off (GTO) thyristor, or a diode, the "first primary electrode region" refers to the anode region or the cathode region. In an FET or SIT, a "second primary electrode region" refers to whichever of the source region or the drain region is not the first primary electrode region; in an IGBT, the "second primary electrode region" refers to whichever of the emitter region or the collector region is not the first primary electrode region; and in the SI thyristor, GTO, or diode, the "second primary electrode region" refers to whichever of the anode region or the cathode region is not the first primary electrode region. In Embodiments 1 to 3 below, a JFET and a MOSFET are illustrated as examples of a high breakdown voltage active element, but the present invention is naturally not limited to junction or insulated gate field effect transistors.

In the description of Embodiments 1 to 3 below, examples are illustrated in which the first conductivity type is the p type, and the second conductivity type is the n type, but the opposite relation may be selected in which the first conductivity type is the n type and the second conductivity type is the p type. In the present specification and the attached drawings, layers or regions labeled "n" or "p" are regions in which electrons or positive holes, respectively, are the majority carriers. Additionally, regions where "+" or "−" are added to the "n" or "p" indicate that these are semiconductor regions having a higher or lower impurity concentration compared to semiconductor regions with no "+" or "−". Furthermore, definitions of "upper" and "lower" in "upper surface" or "lower surface" in the description below are simply a matter of expression concerning the cross-sectional views shown; therefore, if the orientation of the semiconductor device is shifted by 90°, then "left" and "right" are naturally substituted for "upper" and "lower," and if the orientation is shifted by 180°, then "upper" and "lower" are interchanged, for example.

In the description and attached drawings of Embodiments 1 to 3, similar configurations are assigned the same reference characters, and redundant descriptions thereof are omitted. Additionally, the attached drawings described in Embodiments 1 to 3 are not drawn to scale or with the same dimensional ratios for ease of viewing or understanding. The present invention is not limited to the disclosure of Embodiments 1 to 3 as described below as long as it does not depart from the spirit thereof.

In the attached drawings described in the embodiments below, depictions of metal wiring lines, interlayer insulating films, field insulating films, and the like are omitted from FIGS. 1 and 10 in order to clarify the characteristics of the semiconductor device. In the cross-sectional views of FIGS. 5, 9, 14, 15, 17, and 18, depictions beyond a third interlayer insulating film 250 shown in the cross-sectional views of FIGS. 2 and 11 are omitted for ease of viewing.

Embodiment 1

Switching Power Supply Device

Before describing a semiconductor device 31A according to Embodiment 1 of the present invention, a switching power supply device in which a semiconductor device 31A is used will be described.

Figure 6:
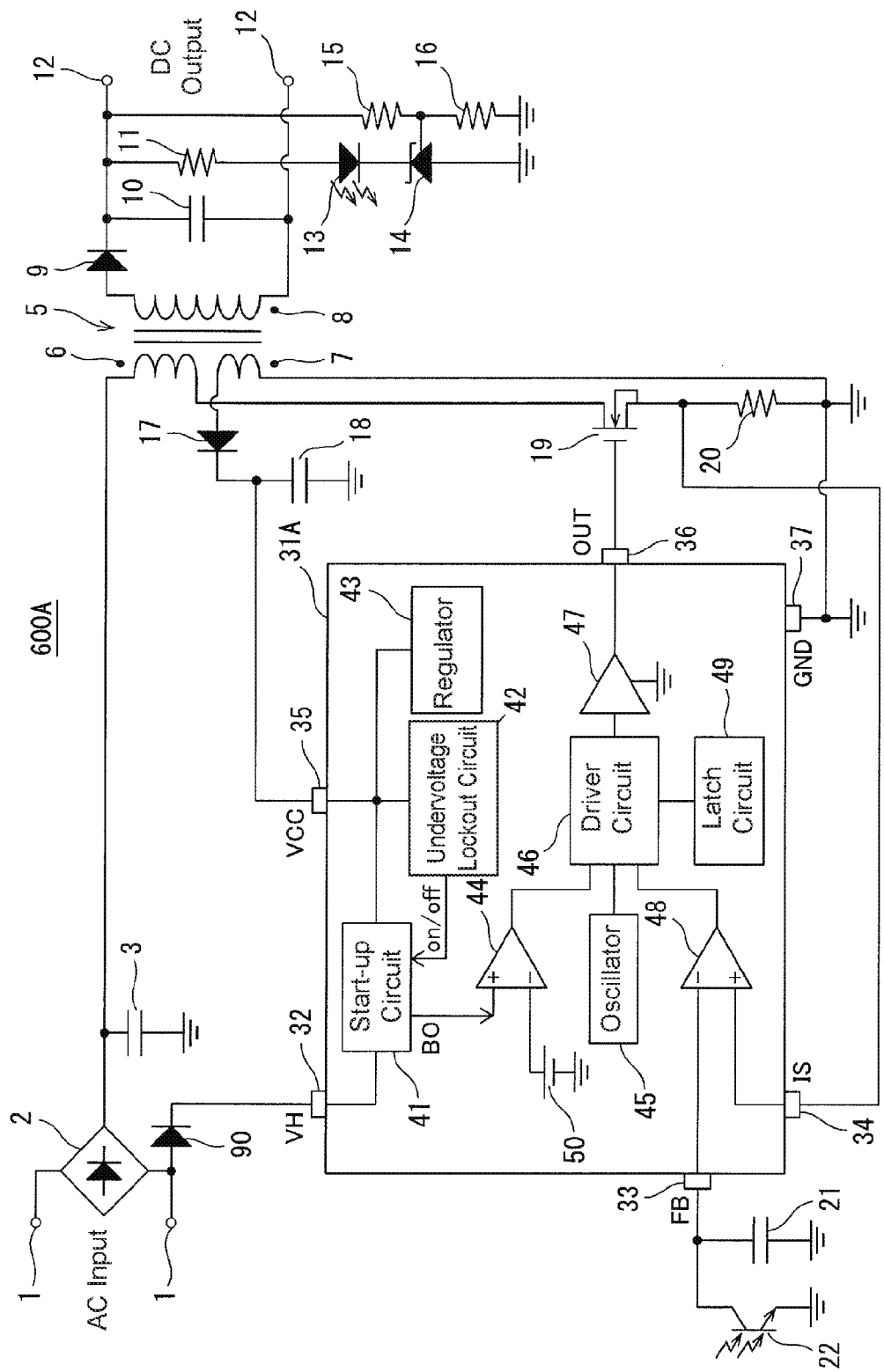
FIG. 6 is a circuit diagram showing a configuration of a switching power supply device including the semiconductor device of Embodiment 1 of the present invention.

As shown in FIG. 6, a switching power supply device 600A includes the semiconductor device 31A (control IC) of Embodiment 1 of the present invention. The semiconductor device 31A according to Embodiment 1 has: a VH terminal 32 (high breakdown voltage input terminal) to which a voltage of approximately 10V to approximately 500V, for example, is applied; a feedback input terminal 33 (hereinafter referred to as the FB terminal); a current sensing input terminal 34 (hereinafter referred to as the IS terminal); a power supply voltage terminal 35 (hereinafter referred to as the VCC terminal); a gate driving terminal 36 of a MOSFET 19 (hereinafter referred to as the OUT terminal); and a ground terminal 37 (hereinafter referred to as a GND terminal). The VH terminal 32 is a terminal that supplies current to the VCC terminal 35 when starting up the power supply. In Embodiment 1, a voltage formed by rectifying and smoothing an AC input voltage is applied to the VH terminal 32. The GND terminal 37 is grounded.

The AC input is supplied to a rectifier 2 through an AC input terminal pair (port) 1. The rectifier 2 is connected to the AC input terminal pair 1 and performs full-wave rectification on the AC input. A power supply capacitor 3 is connected in parallel with an output terminal of the rectifier 2, and is charged by direct current voltage outputted from the rectifier 2. The charged power supply capacitor 3 is a direct current power supply that supplies direct current voltage to the primary coil 6 of a transformer 5. The VH terminal 32 of the semiconductor device 31A is connected to the power supply capacitor 3.

The primary coil 6 is connected between the power supply capacitor 3 and the drain terminal of the MOSFET 19, which functions as a switching element. The source terminal of the MOSFET 19 is connected to the IS terminal 34 of the semiconductor device 31A and one end of a resistor 20. The other end of the resistor 20 is grounded. The resistor 20 converts the current flowing through the MOSFET 19 to voltage, and this voltage is applied to the IS terminal 34. The gate terminal of the MOSFET 19 is connected to the OUT terminal 36 of the semiconductor device 31A.

One end of an auxiliary coil 7 of the transformer 5 is connected in parallel with the anode terminal of a rectifying diode 17. The other end of the auxiliary coil 7 is grounded. A current induced by the switching operation of the MOSFET 19 flows through the auxiliary coil 7. The rectifying diode 17 rectifies the current flowing through the auxiliary coil 7 and charges a smoothing capacitor 18 connected to the cathode terminal of the rectifying diode 17. The smoothing capacitor 18 is connected to the VCC terminal 35 of the semiconductor device 31A, and serves as a direct current power supply for continuing the switching operation of the MOSFET 19.

A voltage based on the voltage of the power supply capacitor 3 is induced in a secondary coil 8 of the transformer 5 by a switching operation of the MOSFET 19. One end of the secondary coil 8 is connected to the anode terminal of the rectifying diode 9. The cathode terminal of the rectifying diode 9 and the other terminal of the secondary coil 8 are connected to a DC output terminal pair (port) 12. Also, the cathode terminal of the rectifying diode 9 and the other terminal of the secondary coil 8 are connected to the smoothing capacitor 10. The rectifying diode 9 rectifies the current flowing through the secondary coil 8 and charges the smoothing capacitor 10. The charged smoothing capacitor 10 supplies a direct current output (DC output) controlled so as to be at a desired direct current voltage value to a load (not shown) connected to the DC output terminal pair 12.

A series resistance circuit constituted of two resistors 15 and 16 and one end of the resistor 11 are connected to the anode terminal of the rectifying diode 9 and one connecting node of the DC output terminal pair 12. The other end of the resistor 11 is connected to the anode terminal of a photodiode 13 constituting a photocoupler. The cathode terminal of the photodiode 13 is connected to the cathode terminal of a shunt regulator 14. The anode terminal of the shunt regulator 14 is grounded. The resistors 11, 15, and 16, the photodiode 13, and the shunt regulator 14 detect the direct current output voltage at both ends of the smoothing capacitor 10, and constitute a voltage detection/feedback circuit that adjusts the direct current output voltage.

A light signal is outputted from the photodiode 13 such that the direct current output voltage of both ends of the smoothing capacitor 10 is adjusted to a prescribed direct current voltage value on the basis of a set value in the shunt regulator 14. This light signal is received by a phototransistor 22 that, together with the photodiode 13, constitutes the photocoupler, and serves as a feedback signal to the semiconductor device 31A. The phototransistor 22 is connected to the FB terminal 33 of the semiconductor device 31A, and the feedback signal is inputted to the FB terminal 33. A capacitor 21 is connected to the phototransistor 22. The capacitor 21 is a noise filter for the feedback signal.

As shown in FIG. 6, the semiconductor device 31A of Embodiment 1 includes a startup circuit 41, an undervoltage-lockout (UVLO) circuit 42, a regulator 43, a brownout (BO) comparator 44, an oscillator 45, a driver circuit 46, an output amplifier 47, a pulse width modulation (PWM) comparator 48, a latch circuit 49, and a reference power supply 50. The startup circuit 41 is connected to the VH terminal 32, the VCC terminal 35, and a non-inversion input terminal of the BO comparator 44. The startup circuit 41 supplies current to the VCC terminal 35 when starting up the power supply.

The undervoltage-lockout circuit 42 is connected to the VCC terminal 35 and the startup circuit 41. When the current supplied from the startup circuit 41 causes the voltage of the VCC terminal 35 to rise to a voltage necessary to operate the semiconductor device 31A, the undervoltage-lockout circuit 42 stops the supply of current from the startup circuit 41 to the VCC terminal 35. Then, the current to the VCC terminal 35 is supplied from the auxiliary coil 7. The regulator 43 is connected to the VCC terminal 35 and generates a reference voltage necessary for the respective parts of the semiconductor device 31A to operate, on the basis of the voltage of the VCC terminal 35. After the power supply is started up, the semiconductor device 31A is driven by the reference voltage outputted from the regulator 43.

The inversion input terminal and the non-inversion input terminal of the PWM comparator 48 are respectively connected to the IS terminal 34 and the FB terminal 33. The PWM comparator 48 inverts the output according to the size relation between the voltage of the inversion input terminal and the voltage of the non-inversion input terminal. The output from the PWM comparator 48 is inputted to the driver circuit 46.

The oscillator 45 is connected to the driver circuit 46, which receives an oscillating signal as input from the oscillator 45. A turn-on signal is inputted from the oscillator 45 to the driver circuit 46, and when the voltage of the non-inversion input terminal of the PWM comparator 48 (that is, the voltage of the FB terminal 33) is greater than the voltage of the inversion input terminal (that is the voltage of the IS terminal 34), then the output signal from the driver circuit 46 enters a "high" state. The output amplifier 47 amplifies the signal in the "high" state outputted from the driver circuit 46, and drives the gate of the MOSFET 19 through the OUT terminal 36.

On the other hand, if the voltage of the inversion input terminal of the PWM comparator 48 is greater than the voltage of the non-inversion input terminal, then the PWM comparator 48 inverts, and the output signal from the driver circuit 46 enters a "low" state. The output amplifier 47 amplifies the signal in the "low" state outputted from the driver circuit 46, and supplies this signal to the gate of the MOSFET 19 through the OUT terminal 36. As a result, the MOSFET 19 turns OFF, and no current flows through the MOSFET 19. By performing variable control of the ON period of the MOSFET 19 by changing the threshold level of the PWM comparator 48 according to the secondary side output voltage in this manner, the secondary side output voltage is stabilized.

The inversion input terminal of the BO comparator 44 is connected to the reference power supply 50. The BO comparator 44 inverts the output according to the size relation between the voltage of the non-inversion input terminal and the voltage of the inversion input terminal. As will be described later, the BO comparator 44 receives, as input, a low voltage signal that has undergone resistor division by resistors inside the startup circuit 41, and thus, the BO comparator 44 can be constituted of a low breakdown voltage MOS. The output from the BO comparator 44 is inputted to the driver circuit 46.

With the "high" signal being outputted from the driver circuit 46, when the voltage of the non-inversion input terminal of the BO comparator 44 is greater than the voltage of the inversion input terminal, the output signal from the driver circuit 46 remains "high." If voltage supply from the AC input stops and the primary side input voltage is reduced, the voltage of the non-inversion input terminal of the BO comparator 44 becomes less than the voltage of the inversion input terminal. As a result, the output signal from the driver circuit 46 becomes "low" and the switching operation of the MOSFET 19 stops, which causes the brownout function to operate.

The latch circuit 49 is connected to the driver circuit 46. When an abnormal state such as a rise in secondary side output voltage, heating of the semiconductor device 31A, or a drop in secondary side output voltage is detected, then the latch circuit 49 forces the output of the driver circuit 46 to become "low" in order to protect from excessive voltage, excessive heat, or excessive current, and stops power supply to the secondary side output. This state is maintained until the VCC power supply voltage is reduced or the control IC 31 is reset. Although there is no special limitation to this effect, the elements constituting respective circuits of the control IC 31 and the like are all formed on the same semiconductor substrate, for example.

<Startup Circuit>

Figure 7:
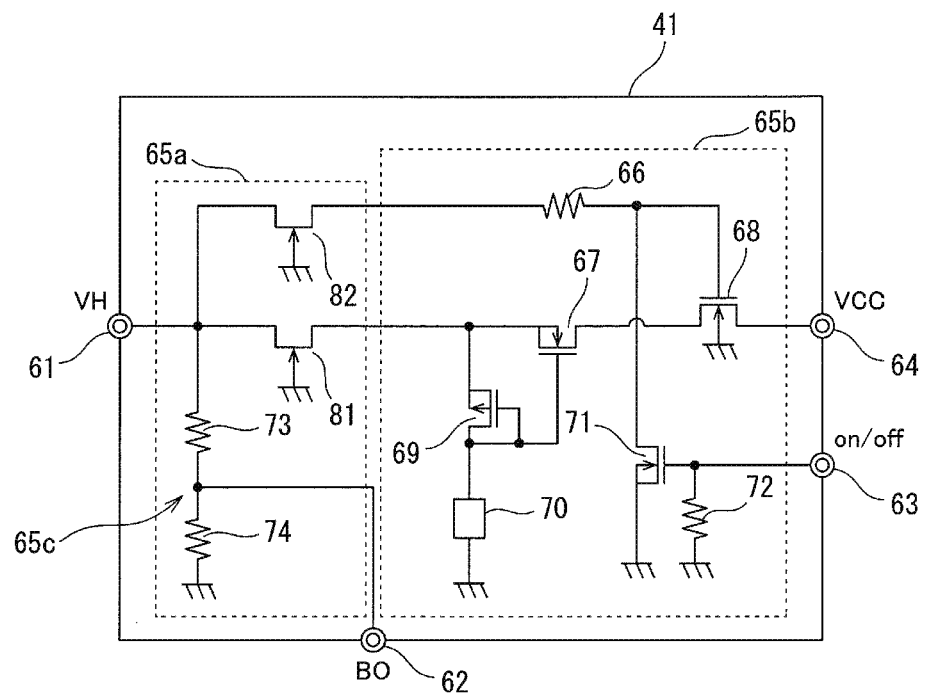
FIG. 7 is a circuit diagram showing a schematic configuration of a startup circuit installed on the semiconductor device shown in FIG. 6.

The startup circuit 41 of the semiconductor device 31A of Embodiment 1 will be described next. As shown in FIG. 7, the startup circuit 41 includes a VH terminal 61 (high breakdown voltage input terminal), a BO terminal 62 (brownout input terminal), an on/off terminal 63 (on/off signal input terminal), and a VCC terminal 64 (power supply voltage terminal). The VH terminal 61 and the VCC terminal 64 are respectively connected to the VH terminal 32 (see FIG. 6) and the VCC terminal 35 (see FIG. 6) of the semiconductor device 31A. The on/off terminal 63 is connected to the undervoltage-lockout circuit 42 (see FIG. 6).

The startup circuit 41 includes a startup element 65a and a startup latter stage circuit 65b. The startup element 65a includes two high breakdown voltage junction field effect transistors (high breakdown voltage JFETs 81 and 82), and a resistor voltage divider 65c constituted of a circuit in which two resistors (first resistor 73 and second resistor 74) are connected in series. The BO terminal 62 is connected to an intermediate node of the circuit in which the first resistor 73 and the second resistor 74 are connected in series. The first resistor 73 and the second resistor 74 are each constituted of a thin film resistor 200A, which is a resistive field plate, as shown in FIG. 1.

The startup latter stage circuit 65b includes a first PMOS transistor 67 and a second PMOS transistor 69, a first NMOS transistor 68 and a second NMOS transistor 71, a load 70, and a resistor 72.

The BO terminal 62 is connected to the non-inversion input terminal of the BO comparator 44. In other words, the input voltage to the VH terminal 61 is divided by the first resistor 73 and the second resistor 74, and this divided voltage is inputted to the non-inversion input terminal of the BO comparator 44. Although there is no special limitation, the resistance of the first resistor 73 and the second resistor 74 is 1MΩ or greater, and although there is no specific upper limit on the resistance, the upper limit is at or below a resistance that can be created inside the semiconductor device. This upper limit is approximately 10MΩ or less, for example.

The first JFET 81 and the second JFET 82 are normally-on junction field effect transistors, and the gate terminals thereof are grounded. Additionally, the drain terminals of the first and second JFETs 81 and 82 are both connected to the VH terminal 61. The source terminal of the first JFET 81 is connected to the source terminal of the first PMOS transistor 67 and the second PMOS transistor 69.

The gate terminal of the first PMOS transistor 67 is connected to both the gate terminal and the drain terminal of the second PMOS transistor 69. The drain terminal of the second PMOS transistor 69 is connected to the load 70. The first NMOS transistor 68 is connected between the drain terminal of the first PMOS transistor 67 and the VCC terminal 64.

The gate terminal of the first NMOS transistor 68 is connected to the source terminal of the second JFET 82 through the resistor 66. The gate terminal of the first NMOS transistor 68 is connected to the drain terminal of the second NMOS transistor 71. The gate terminal of the second NMOS transistor 71 is connected to the on/off terminal 63. The source terminal of the second NMOS transistor 71 is grounded. The gate terminal of the second NMOS transistor 71 is also grounded through the resistor 72.

In the startup circuit 41 having such a configuration, the voltage/current characteristics of the second PMOS transistor 69 and the impedance of the load 70 determine the current flowing through the second PMOS transistor 69. The second PMOS transistor 69 and the first PMOS transistor 67 are in a current mirror connection. The W/L value of the second PMOS transistor 69 is 1, whereas the W/L value of the first PMOS transistor 67 is 100. Thus, 100 times the current in the second PMOS transistor 69 flows through the first PMOS transistor 67. "W" and "L" respectively refer to the channel width and the channel length.

The first NMOS transistor 68 functions as a switch to switch between on and off on the basis of the on/off signal supplied from the undervoltage-lockout circuit 42 through the on/off terminal 63. If the on/off signal is "low," then the second NMOS transistor 71 turns on and a high voltage is inputted to the gate terminal of the first NMOS transistor 68, and thus, the switch turns on. By the switch turning on, when starting up the power supply as described above, current is supplied from the startup circuit 41 to the VCC terminal 35 of the semiconductor device 31A.

On the other hand, if the on/off signal is "high," then the second NMOS transistor 71 turns on and the gate voltage of the first NMOS transistor 68 becomes zero, and thus, the switch turns off. Thus, the current path between the VH terminal 61 and the VCC terminal 64 is blocked, which stops the supply of current from the startup circuit 41 to the VCC terminal 35.

In some cases, the first JFET 81 and the second JFET 82 form one JFET. If only the first JFET 81 is used, for example, then the second JFET 82 becomes unnecessary, and wiring lines connected to the source of the second JFET 82 and the resistor 66 simply need to be connected to the source of the first JFET 81.

<Structure of Semiconductor Device>

Next, the specific structure of the semiconductor device 31A of Embodiment 1 will be described with reference to FIGS. 1 to 5.

As shown in FIG. 2, the semiconductor device 31A of Embodiment 1 is configured over a semiconductor substrate 100, which is a main constituent. As the semiconductor substrate 100, a first conductivity type (p-type) semiconductor substrate made of monocrystalline silicon, for example, is used.

Figure 2:
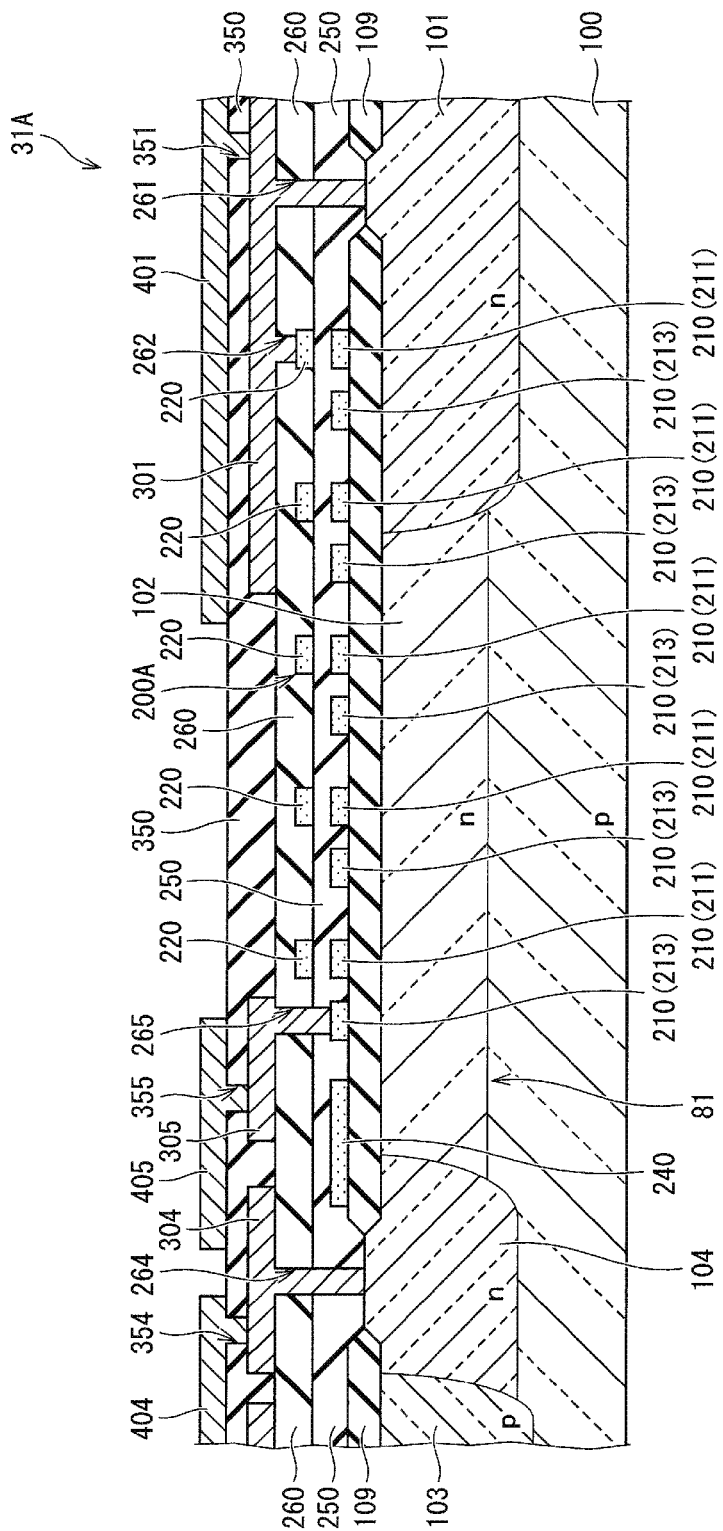
FIG. 2 is a cross-sectional view of main components showing a cross-sectional structure of FIG. 1 along the line IIa-IIa.

As shown in FIG. 1, the semiconductor device 31A is provided with the first JFET 81 and the second JFET 82 constituting the startup circuit 41 shown in FIG. 7. The first JFET 81 and the second JFET 82 have almost the same configuration, and thus, descriptions thereof will be focused on the first JFET 81 with descriptions of the second JFET 82 being omitted.

As shown in FIG. 2, the first JFET 81 has a second conductivity type (n-type) first primary electrode region 101 (drain region), a second conductivity type (n-type) drift region 102, a first conductivity type (p-type) base region 103 (gate region), a second conductivity type (n-type) second primary electrode region 104 (source region), and a gate electrode 240.

The first primary electrode region 101 is provided over the semiconductor substrate 100. The drift region 102 is provided on the semiconductor substrate 100 so as to surround the first primary electrode region 101 while being in contact therewith. The first primary electrode region 101 is a region in common between the first JFET 81 and the second JFET 82.

The base region 103 is provided on the semiconductor substrate 100 and to the outside of the drift region 102. The base region 103 is shown to be at a gap from the drift region 102 in FIG. 2, but is selectively provided so as to be in contact with the drift region 102 in another cross-section.

A plurality of the second primary electrode regions 104 are provided on the semiconductor substrate 100 and to the outside of the drift region 102 and are in contact with the drift region 102 so as to be between the drift region 102 and the base region 103. A gate electrode 240 is configured so as to have a plan view pattern in which it extends in a ring shape surrounding the first primary electrode region 101 on the upper surface of the semiconductor substrate 100. The gate electrode 240 is provided on a field insulating film 109 in FIG. 2, but a portion thereof is drawn onto the base region 103 in another cross-section.

The drift region 102 is formed so as to have a lower impurity concentration than the first and second primary electrode regions 101 and 104, and constitute the voltage withstanding region of the JFETs 81 and 82, or in other words, the voltage withstanding structure.

Four second primary electrode regions 104 (source regions) are provided, for example, of which three are second primary electrode regions 104 of the JFET 81 and the remaining one is a second primary electrode region 104 of the JFET 82. The gate electrode 240 is made of a polycrystalline silicon film into which an impurity that reduces resistance is implanted, for example. The base region 103 is a channel formation region where the channel is formed.

As shown in FIG. 2, the thin film resistor 200A, which is a resistive field plate, is provided over the voltage withstanding region (drift region 102) of the first and second JFETs 81 and 82 and over the first primary electrode region 101 with the field insulating film 109 therebetween. One end of the thin film resistor 200A is connected to a first primary electrode wiring line 301, and the thin film resistor 200A is formed in a spiral on the field insulating film 109 so as to surround the first primary electrode region 101. As will be described later in detail, the thin film resistor 200A has a structure in which first thin film resistor units 210 formed in a first thin film semiconductor layer and second thin film resistor units 220 formed in a second thin film semiconductor layer are alternately connected in series. The field insulating film 109 is selectively formed by selective oxidation, and is made of a silicon dioxide film.

On the upper surface of the semiconductor substrate 100, a first interlayer insulating film 250 made of a silicon dioxide film, for example, is formed so as to cover the first thin film resistor unit 210 of the thin film resistor 200A and the gate electrode 240. On the upper surface of the first interlayer insulating film 250, the second thin film resistor unit 220 of the thin film resistor 200A and the like are disposed.

On the upper surface of the first interlayer insulating film 250, a second interlayer insulating film 260 made of a silicon dioxide film, for example, is formed so as to cover the first thin film resistor unit 210. A first primary electrode wiring line 301, a second primary electrode wiring line 304, a resistor connection wiring line 305, and the like, which are formed of a first layer metal wiring layer, are provided on the upper surface of the second interlayer insulating film 260.

A third interlayer insulating film 350 is provided over the upper surface of the second interlayer insulating film 260 so as to cover the first primary electrode wiring line 301, the second primary electrode wiring line 304, the resistor connection wiring line 305, and the like. A wiring line 401, a wiring line 404, a wiring line 405, and the like, which are formed of a second layer metal wiring layer, are provided on the upper surface of the third interlayer insulating film 350.

The first primary electrode wiring line 301 is electrically and metallurgically connected to the first primary electrode region 101 (drain region) through a contact hole 261 penetrating the second interlayer insulating film 260 and the first interlayer insulating film 250. Also, the first primary electrode wiring line 301 is electrically and metallurgically connected to the second thin film resistor unit 220, which is one end (inner termination region) of the thin film resistor 200A through a contact hole 262 formed in the second interlayer insulating film 260.

The wiring line 401 is electrically and metallurgically connected to the first primary electrode wiring line 301 through a contact hole 351 penetrating the third interlayer insulating film 350. The first primary electrode region 101 is common to the first JFET 81 and the second JFET 82, and the wiring line 401 is connected to the VH terminal 61 of the startup circuit 41. In other words, voltage is applied from outside to one end of the first primary electrode region 101, the first primary electrode wiring line 301, and the thin film resistor 200A through the VH terminal 61.

Although not shown, the base region 103 and the gate electrode 240 are electrically and metallurgically connected to a wiring line to which ground potential is applied.

As shown in FIG. 2, the second primary electrode wiring line 304 is electrically and metallurgically connected to three second primary electrode regions 104, for example, through a contact hole 264 penetrating the second interlayer insulating film 260 and the first interlayer insulating film. The wiring line 404 is electrically and metallurgically connected to the second primary electrode wiring line 304 through a contact hole 354 penetrating the third interlayer insulating film 350.

Also, the resistor connection wiring line 305 is electrically and metallurgically connected to the first thin film resistor unit 210, which is another end (outer termination region) of the thin film resistor 200A, through a contact hole 265 formed through the second interlayer insulating film 260 and the first interlayer insulating film 250. The wiring line 405 is electrically and metallurgically connected to the resistor connection wiring line 305 through a contact hole 355 penetrating the third interlayer insulating film 350. The wiring line 405 is electrically and metallurgically connected to the resistor connection wiring line 305 through a contact hole 355 penetrating the third interlayer insulating film 350. A ground potential is applied to the wiring line 405 as the reference potential.

Of the four second primary electrode regions 104 to which the second primary electrode wiring line 304 is connected, three second primary electrode regions 104 belong to the first JFET 81. The remaining one second primary electrode region 104 belongs to the second JFET 82.

In Embodiment 1, the first resistor 73 and the second resistor 74 were formed of the thin film resistor 200A of the startup element 65a, but it is possible to form only the first resistor 73 of the thin film resistor 200A and to form the resistor 74 in a region outside the startup element 65a. If 500V is applied to the VH terminal 61, then the second resistor 73 is directly connected to the VH terminal 61 and therefore needs to have a breakdown voltage of 500V, but only approximately 5V is applied to the resistor 74. Therefore, the resistor 74 can be provided on an insulating film having a thickness of several dozen nm on the semiconductor substrate, and can be formed by a general thin film resistor process.

In the startup element 65a, a structure for increasing breakdown voltage is realized by the junction between the base region 103 and the drift region 102, and the structure for large current is realized by the second primary electrode region 104, and thus, a balance can be achieved between increased breakdown voltage and lower ON resistance. When voltage is applied to the first primary electrode region 101, a drain current flows radially. When the second primary electrode region 104 is biased to a positive potential and the potential rises to a certain value, then the drift region 102 is cut off by a depletion layer and the drain current is blocked. In Embodiment 1, the area between drain and source is designed to have a breakdown voltage of 500V or greater, for example, primarily by the junction between the base region 103 and the drift region 102.

<Configuration of Thin Film Resistor>

Next, a specific configuration of the thin film resistor 200A will be described.

Figure 3:
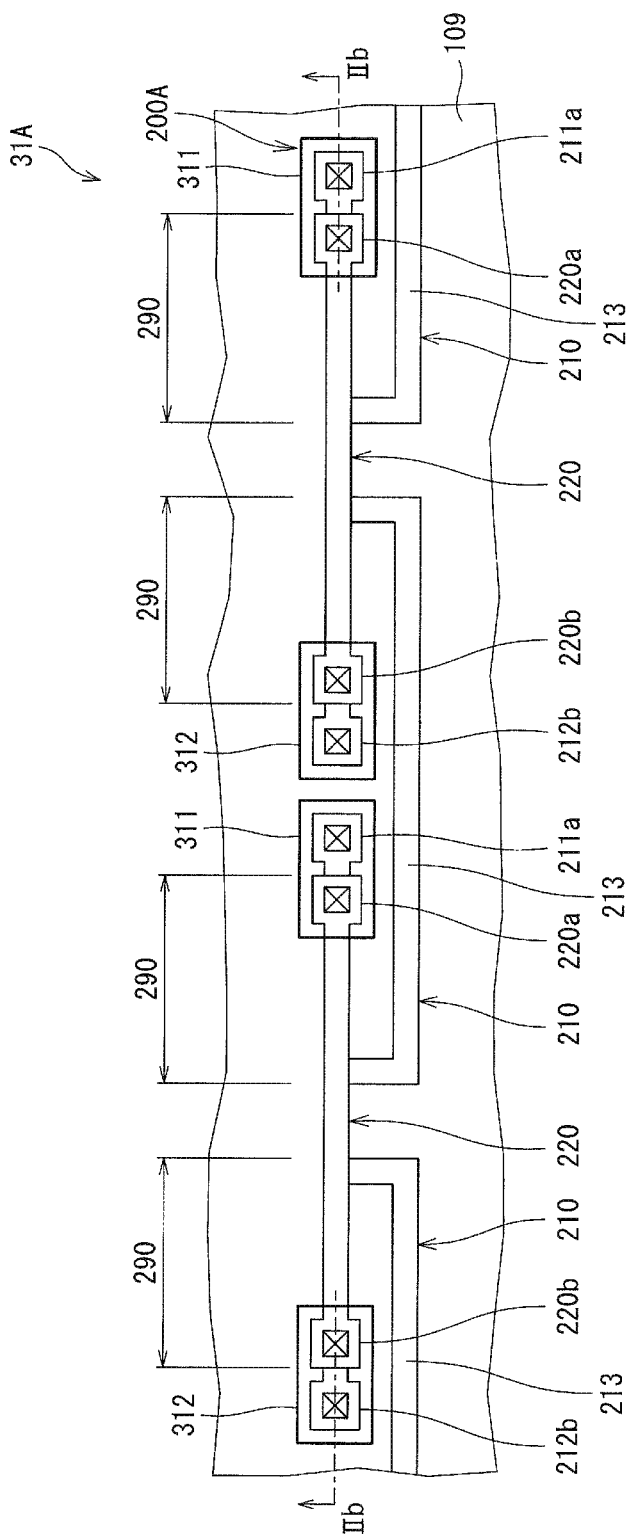
FIG. 3 is a plan view of main components showing an enlarged view of a region A, which is a region of the thin film resistor in FIG. 1 surrounded by the dotted line.
Figure 5:
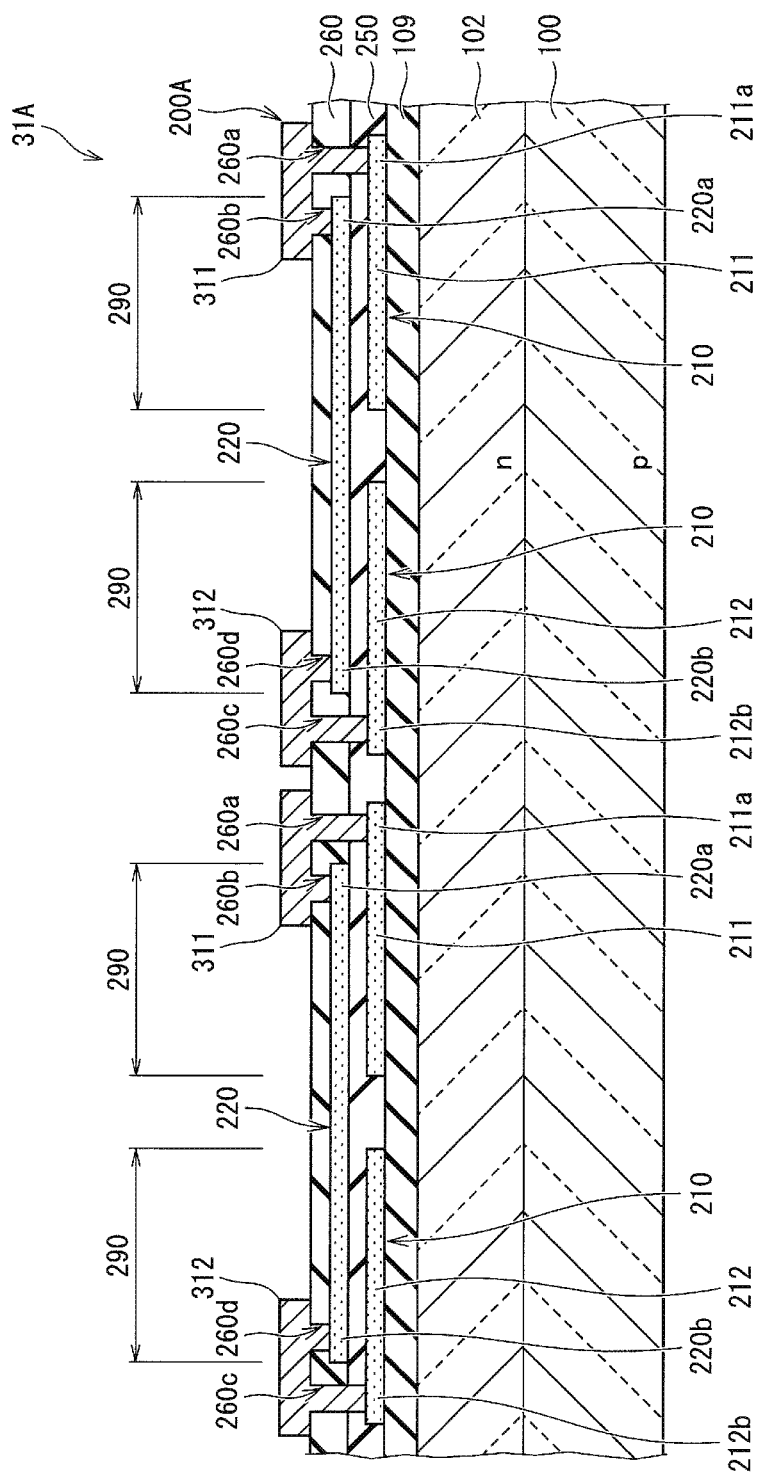
FIG. 5 is a cross-sectional view of main components showing a cross-sectional structure of FIG. 3 along the line IIb-IIb.

As shown in FIGS. 1 and 3, the thin film resistor 200A has a configuration in which the plurality of first thin film resistor units 210 and the plurality of second thin film resistor units 220 are alternately connected in series, one at a time. Also, as shown in FIGS. 3 and 5, the thin film resistor 200A extends while being folded over such that portions of the first thin film resistor unit 210 and the second thin film resistor unit 220 respectively overlap. In other words, the thin film resistor 200A extends in a circle such that portions of the first thin film resistor unit 210 and the second thin film resistor unit 220 respectively overlap.

Also, as shown in FIG. 1, the thin film resistor 200A is configured so as to have a plan view pattern whereby the thin film resistor 200A is formed so as to spiral around one end thereof. As shown in FIG. 3, in Embodiment 1, the one end of the thin film resistor 200A is electrically connected to the first primary electrode region 101, and thus, the thin film resistor 200A is formed so as to spiral around the first primary electrode region 101.

As shown in FIG. 5, the first thin film resistor unit 210 and the second thin film resistor unit 220 are formed in differing thin film semiconductor layers. In Embodiment 1, the first thin film resistor unit 210 is formed in the first thin film semiconductor layer from the semiconductor substrate 100, for example. Meanwhile, the second thin film resistor unit 220 is formed in the second thin film semiconductor layer from the semiconductor substrate 100 side. The first thin film resistor unit 210 and the second thin film resistor unit 220 are both formed of a polycrystalline silicon (doped polysilicon) film as thin film semiconductor layers in which impurity ions are implanted, for example.

Figure 4:
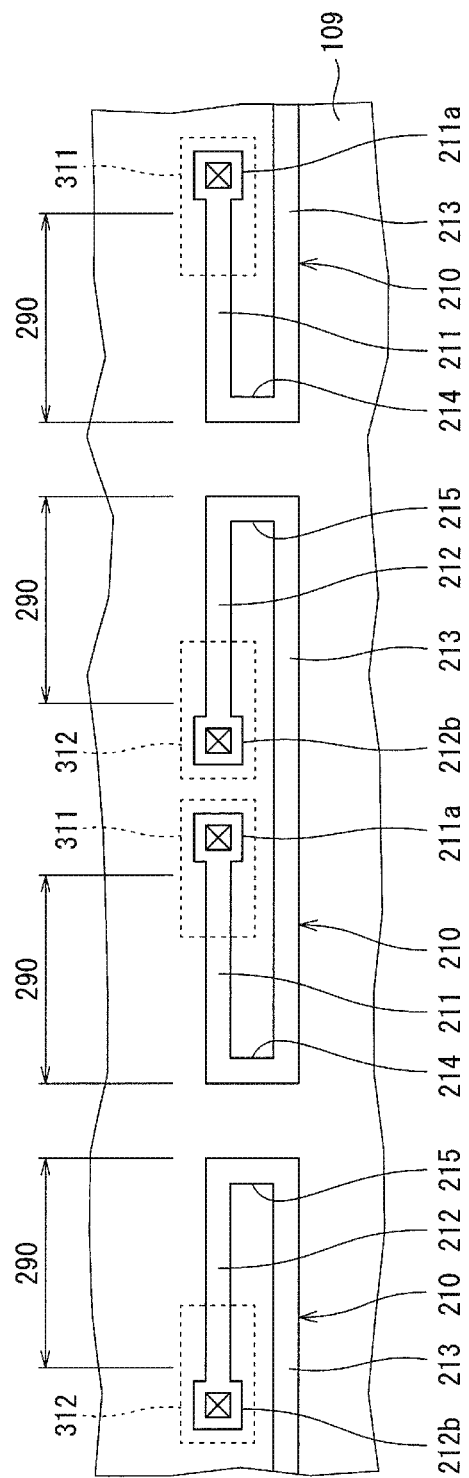
FIG. 4 is a plan view of main components of the thin film resistor shown in FIG. 3, where the depiction of a second thin film resistor unit is omitted.

As shown in FIG. 4, the first thin film resistor unit 210 is configured so as to have a plan view pattern whereby the first thin film resistor unit 210 is formed so as to loop around in a ring shape such that one end thereof faces another end. As shown in FIG. 3, the second thin film resistor unit 220 is configured to have a plan view pattern in which the second thin film resistor unit 220 extends in a straight line or a curve from one end of one first thin film resistor unit 210 to another end of another first thin film resistor unit 210, among adjacent first thin film resistor units 210. Also, the second thin film resistor unit 220 has a contact section 220a on one end and a contact section 220b on another end.

As shown in FIG. 4, the first thin film resistor unit 210 has: a first portion 211 provided with a contact section 211a on one end thereof, the first portion 211 extending along the lengthwise direction of the second thin film resistor unit 220; and a second portion 212 provided with a contact section 212b formed apart from the contact section 211a so as to face the contact section 211a on one end, the second portion 212 extending along the lengthwise direction of the second thin film resistor unit 220 away from the first portion 211. The first thin film resistor unit 210 has a third portion 213 that extends from the other end of the first portion 211 to the other end of the second portion 212, and that is arranged so as to be parallel to the first portion 211 and the second portion 212. The first thin film resistor unit 210 also has: a fourth portion 214 having one end that links to the other end of the first portion 211, the other end of the fourth portion 214 linking to the one end of the third portion 213; and a fifth portion 215 having one end that links to the other end of the second portion 212 and another end that links to the other end of the third portion 213. As a whole, the first thin film resistor unit 210 has the contact section 211a of the first portion 211 on one end and the contact section 212b of the second portion 212 on another end.

As shown in FIGS. 3 and 5, the first thin film resistor unit 210 is arranged such that the first portion 211 and the second portion 212 overlap the second thin film resistor unit 220, and overlapping portions 290 are each formed by the first portion 211, the second portion 212, and the second thin film resistor unit 220. The overlapping portions 290 are provided periodically so as to be scattered along the lengthwise direction of the thin film resistor 200A.

As shown in FIGS. 3 and 5, the first thin film resistor unit 210 and the second thin film resistor unit 220 are electrically connected through a first relay wiring line 311 and a second relay wiring line 312 formed in the second metal wiring layer. Specifically, the contact section 211a on the one end of the first thin film resistor unit 210 is electrically and metallurgically connected to one end of the first relay wiring line 311 through a contact hole 260a penetrating the second interlayer insulating film 260 and the first interlayer insulating film 250. Also, the contact section 220a on the one end of the second thin film resistor unit 220 is electrically and metallurgically connected to the other end of the first relay wiring line 311 through a contact hole 260b penetrating the second interlayer insulating film 260.

Additionally, the contact section 212b on the other end of the first thin film resistor unit 210 is electrically and metallurgically connected to one end of the second relay wiring line 312 through a contact hole 260c penetrating the second interlayer insulating film 260 and the first interlayer insulating film 250. The contact section 220b on the other end of the second thin film resistor unit 220 is electrically and metallurgically connected to the other end of the second relay wiring line 312 through a contact hole 260d penetrating the second interlayer insulating film 260.

The contact sections 211a and 212b of the first thin film resistor unit 210 are formed to have a greater width than the intermediate portion between the contact sections in order to mitigate contact defects resulting from mask offset. Similarly, the contact sections 220a and 220b of the second thin film resistor unit 220 are also formed to have a greater width than the intermediate portion between the contact sections.

In the semiconductor device 30A of Embodiment 1, the thin film resistor 200A extends so as to fold over such that portions of the first thin film resistor unit 210 and the second thin film resistor unit 220, respectively, overlap. Thus, if the plan view size of the thin film resistor 200A is to be made uniform, then compared to a conventional thin film resistor arranged in a planar manner, the specific resistance component per unit area increases the more the first thin film resistor unit 210 and the second thin film resistor unit 220 overlap in the overlapping portion 290, and thus, it is possible to increase resistance without increasing the plan view size. As a result, in the semiconductor device 30A of Embodiment 1, the thin film resistor 200A can be made to have a higher resistance while mitigating an increase in chip size.

Also, by adjusting the length of the overlapping portion 290, it is possible to change the total resistance of the thin film resistor 200A with ease, and thus, it is possible to improve design flexibility for the semiconductor device 31A.

In the semiconductor device 31A of Embodiment 1, while an input voltage is being applied, current is always consumed in the resistor voltage divider 65c. The first resistor 73 and the second resistor 74 of the resistor voltage divider 65c are configured in the thin film resistor 200A, which is designed to have increased resistance, and thus, compared to conventional semiconductor devices, the amount of current consumed is lower, and it is possible to have a reduced power consumption.

Also, in the semiconductor device 30A of Embodiment 1, the amount of voltage applied on both ends of the thin film resistor 200A is reduced by increasing the area of the startup element 65a, even without increasing the number of times the thin film resistor 200A is wound, and thus, it is possible to reduce power consumption while mitigating an increase in chip size.

In the semiconductor device 31A of Embodiment 1, the amount of voltage applied on both ends of the thin film resistor 200A is reduced by diluting the concentration of impurities, even without increasing the sheet resistance thereof, and thus, it is possible to reduce power consumption while mitigating an increase in chip size.

As shown in FIG. 3, in the thin film resistor 200A, the length of the overlapping portions 290 changes according to the pitch at which the first thin film resistor units 210 are disposed, and thus, it is preferable that the pitch at which the first thin film resistor units 210 are disposed be as narrow as possible.

Modification Example of Embodiment 1

Figure 8:
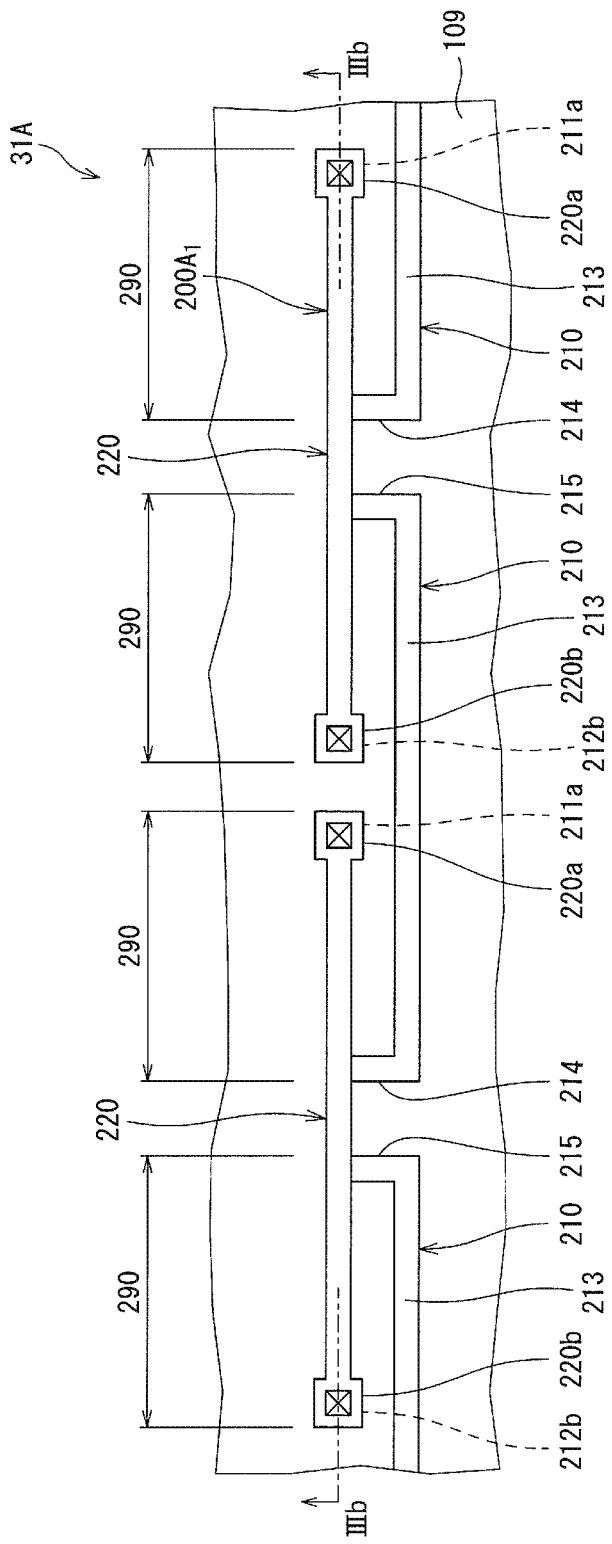
FIG. 8 is a plan view of main components showing a modification example of a semiconductor device of Embodiment 1 of the present invention.
Figure 9:
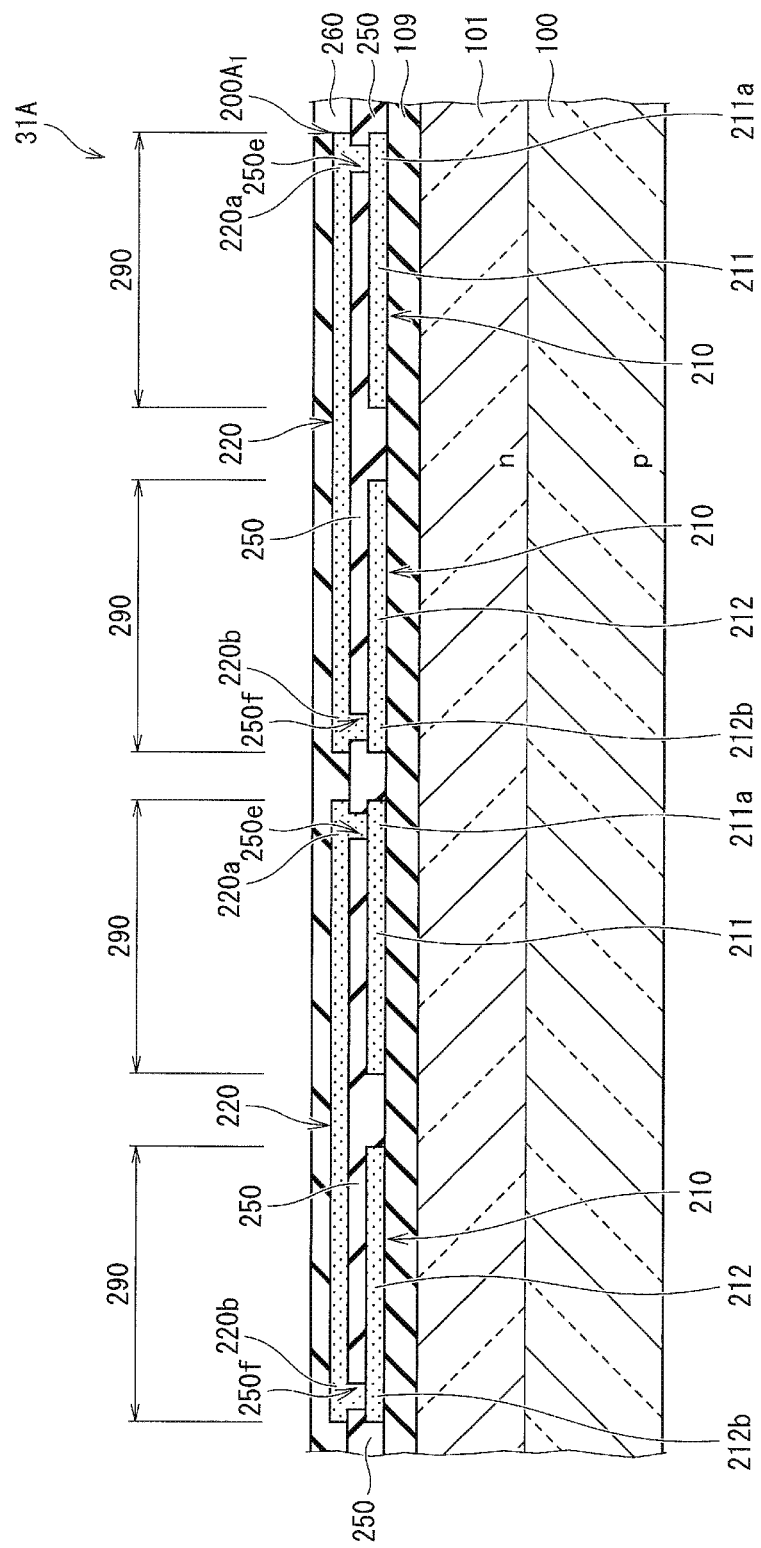
FIG. 9 is a cross-sectional view of main components showing a cross-sectional structure of FIG. 8 along the line IIIb-IIIb.

Next, a modification example of the semiconductor device 30A of Embodiment 1 will be described with reference to FIGS. 8 and 9.

As shown in FIGS. 3 and 5, a case was described in which the semiconductor device 31A of Embodiment 1 includes the thin film resistor 200A in which the first thin film resistor unit 210 and the second thin film resistor unit 220 are connected to each other through the relay wiring lines 311 and 312. In contrast, as shown in FIGS. 8 and 9, the modification example of the semiconductor device 31A of Embodiment 1 includes a thin film resistor $200A_1$ in which the first thin film resistor unit 210 and the second thin film resistor unit 220 are connected to each other directly without the use of relay wiring lines. Specifically, the contact section 211a on one end of the first thin film resistor unit 210 is electrically and metallurgically connected directly to the contact section 220a on one end of the second thin film resistor unit 220 through a contact hole 250e penetrating the first interlayer insulating film 250. Additionally, the contact section 212b on the other end of the first thin film resistor unit 210 is electrically and metallurgically connected directly to the contact section 220b on the other end of the second thin film resistor unit 220 through a contact hole 250f penetrating the first interlayer insulating film 250.

Even in the modification example of the semiconductor device 31A of Embodiment 1 configured in this manner, the thin film resistor $200A_1$, which extends while being folded over such that respective portions of the first thin film resistor unit 210 and the second thin film resistor unit 220 overlap, is provided, and thus, similar to the semiconductor device 31A of Embodiment 1 described above, it is possible to increase resistance of the thin film resistor 200A₁ while mitigating an increase in chip size. Also, it is possible to reduce power consumption while mitigating an increase in chip size. Additionally, it is possible to reduce power consumption while mitigating variation in resistance.

In the modification example of the semiconductor device 31A of Embodiment 1, the contact section 211a on the one end of the first thin film resistor unit 210 overlaps the contact section 220a on the one end of the second thin film resistor unit 220, and the contact section 212b on the other end of the first thin film resistor unit 210 overlaps the contact section 220b on the other end of the second thin film resistor unit 220, and the length of the overlapping portions 290 is greater than in the thin film resistor 200A of Embodiment 1. Thus, it is possible to further increase the resistance of the thin film resistor 200A₁ while mitigating an increase in chip size.

In Embodiment 1 and the modification example of Embodiment 1 described above, a case was described in which the first thin film resistor unit 210 is formed in the first thin film resistor layer and the second thin film resistor unit 220 is formed in the second thin film resistor layer. However, the present invention is not limited to such a configuration, and a configuration may be adopted in which the second thin film resistor unit is formed in the first thin film resistor layer and the first thin film resistor unit 210 is formed in the second thin film resistor layer, for example.

Embodiment 2

A semiconductor device 31B according to Embodiment 2 of the present invention has almost the same configuration as the semiconductor device 31A of Embodiment 1, but the configuration of the thin film resistor differs. Below, a thin film resistor 200B of the semiconductor device 31B of Embodiment 2 will be described with reference to FIGS. 10 to 15.

Figure 10:
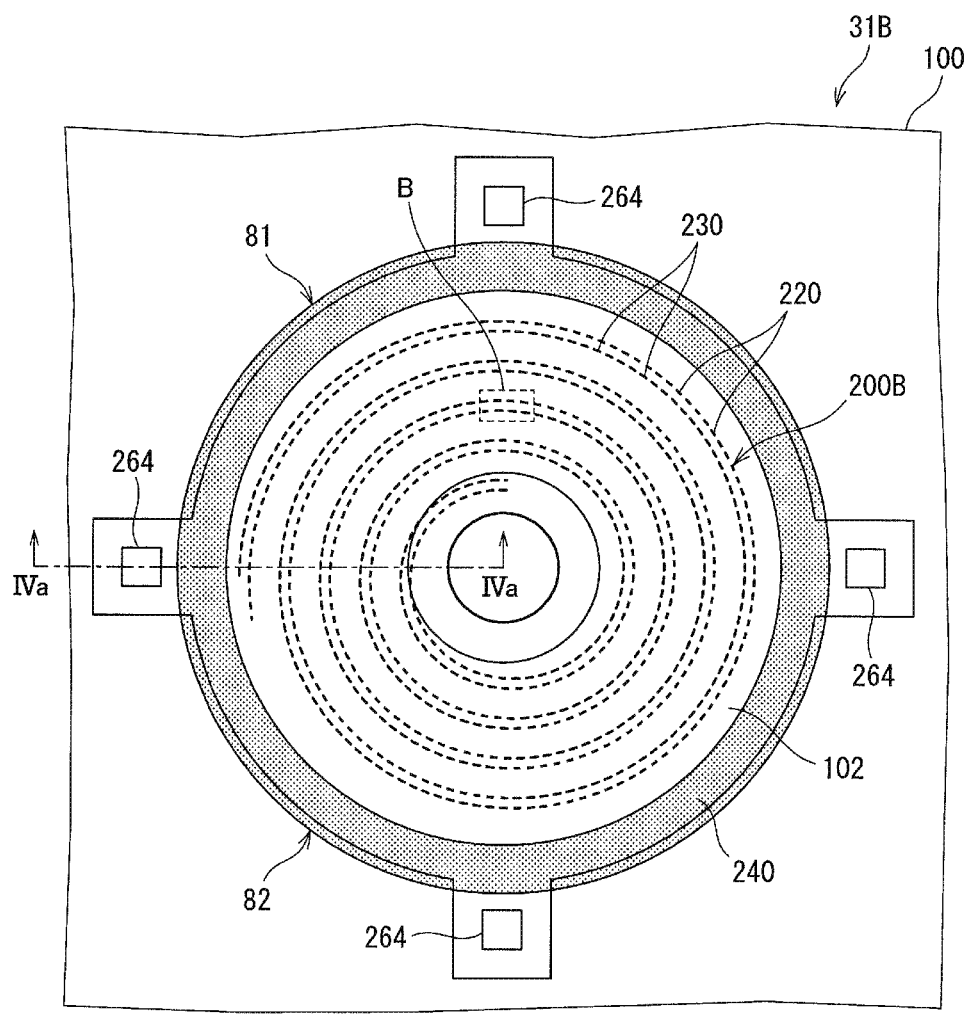
FIG. 10 is a plan view of main components showing a schematic configuration of a semiconductor device of Embodiment 2 of the present invention.
Figure 11:
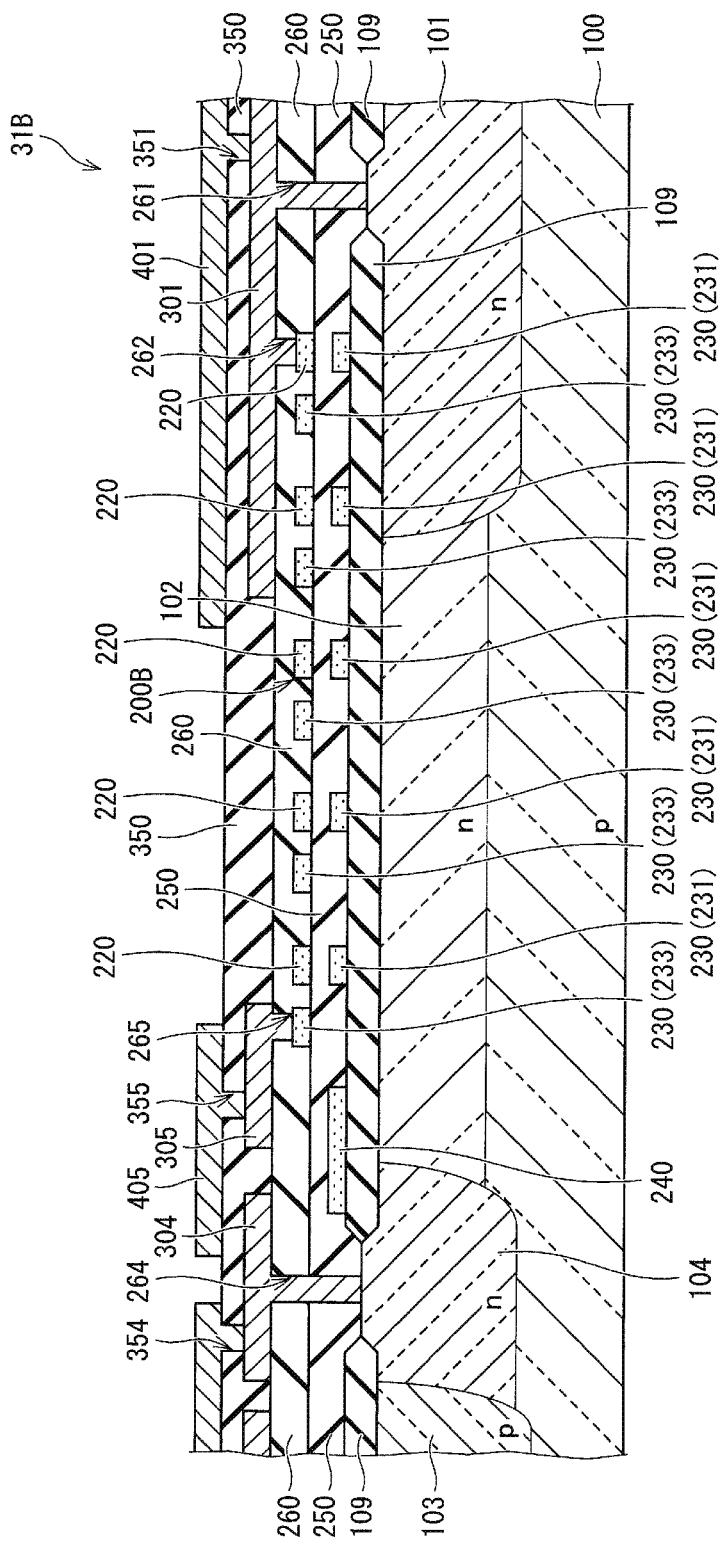
FIG. 11 is a cross-sectional view of main components showing a cross-sectional structure of FIG. 10 along the line IVa-IVa.

As shown in FIGS. 10 and 11, the semiconductor device 31B of Embodiment 2 of the present invention includes the thin film resistor 200B. As shown in FIG. 11, the thin film resistor 200B is provided on the drift region 102, which is a voltage withstanding region, of the first and second JFETs 81 and 82 and over the first primary electrode region 101 with the field insulating film 109 therebetween.

Figure 12:
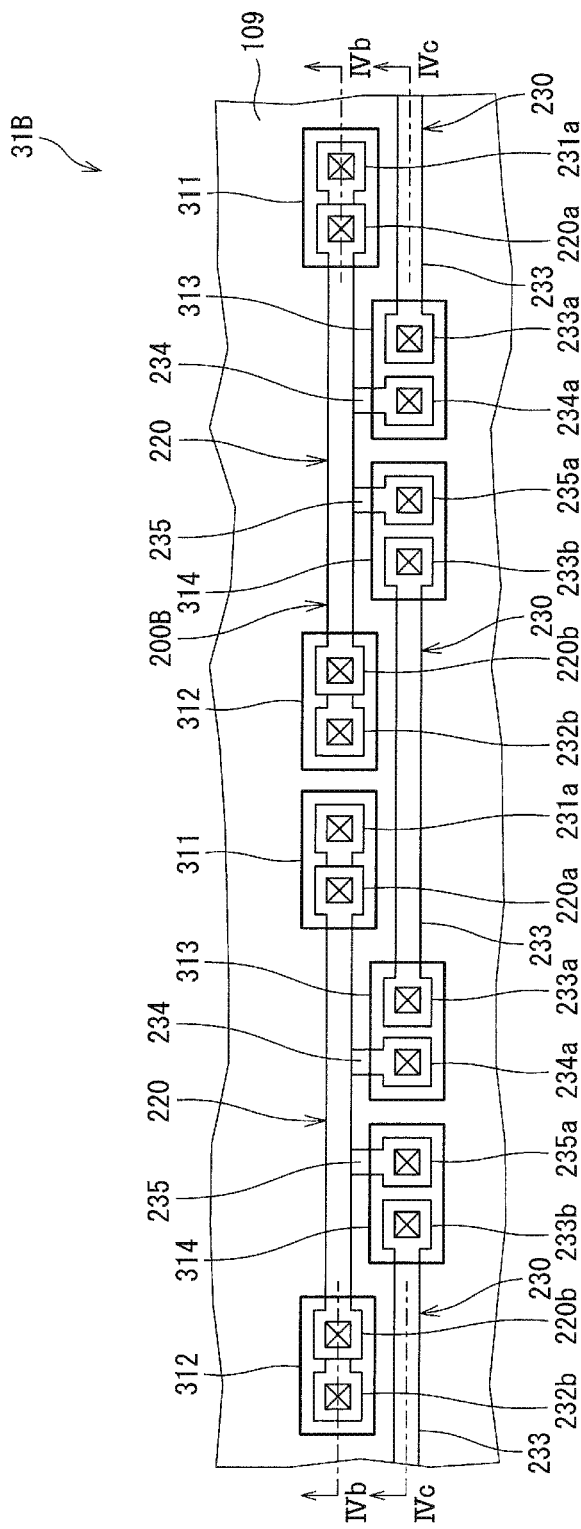
FIG. 12 is a plan view of main components showing an enlarged view of a region B, which is a region of the thin film resistor in FIG. 10 surrounded by the dotted line.
Figure 14:
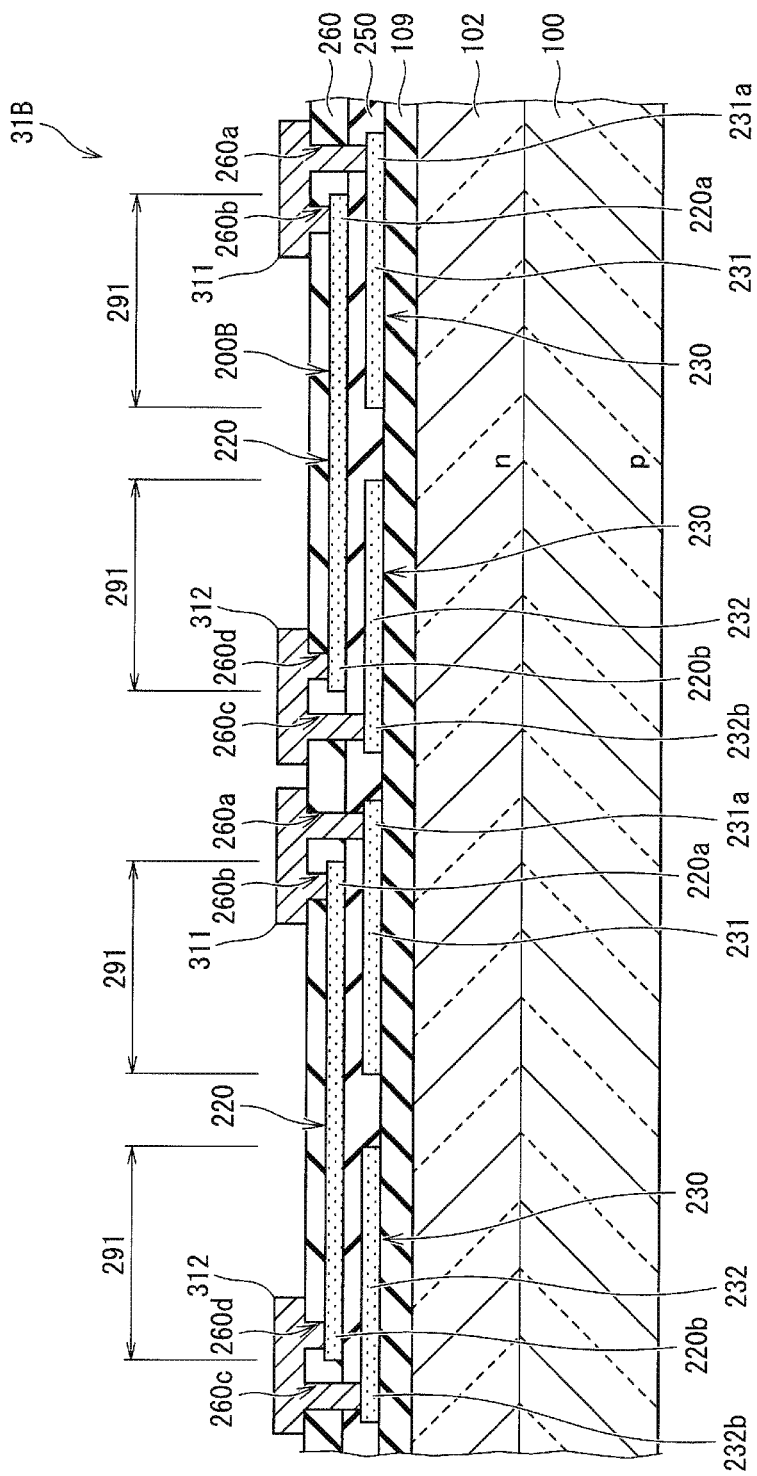
FIG. 14 is a cross-sectional view of main components showing a cross-sectional structure of FIG. 12 along the line IVb-IVb.

As shown in FIGS. 10 and 12, the thin film resistor 200B has a configuration in which the plurality of first thin film resistor units 230 and the plurality of second thin film resistor units 220 are alternately connected in series, one at a time. Also, as shown in FIGS. 12 and 14, the thin film resistor 200B extends while being folded over such that portions of the first thin film resistor unit 230 and the second thin film resistor unit 220 respectively overlap. Also, as shown in FIG. 10, the thin film resistor 200B is configured so as to have a plan view pattern whereby the thin film resistor 200B is formed so as to spiral around one end thereof.

Figure 15:
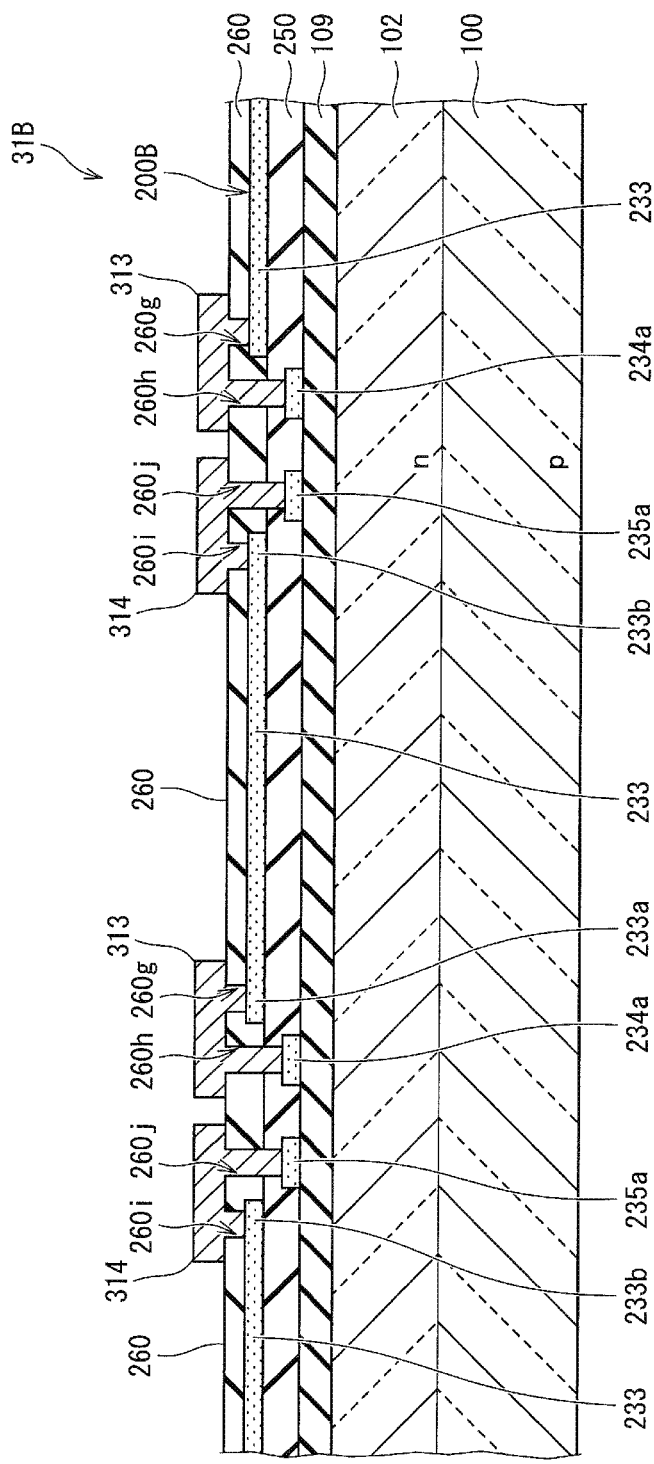
FIG. 15 is a cross-sectional view of main components showing a cross-sectional structure of FIG. 12 along the line IVc-IVc.

As shown in FIGS. 14 and 15, the first thin film resistor unit 230 and the second thin film resistor unit 220 are formed in differing thin film semiconductor layers. In Embodiment 2, the second thin film resistor unit 220 is formed in the second thin film semiconductor layer from the semiconductor substrate 100 side, for example. Meanwhile, the first thin film resistor unit 230 is formed in the first and second thin film semiconductor layers from the semiconductor substrate 100 side. The first thin film resistor unit 230 and the second thin film resistor unit 220 are both formed of a doped polysilicon film as thin film semiconductor layers in which impurity ions are implanted.

Figure 13:
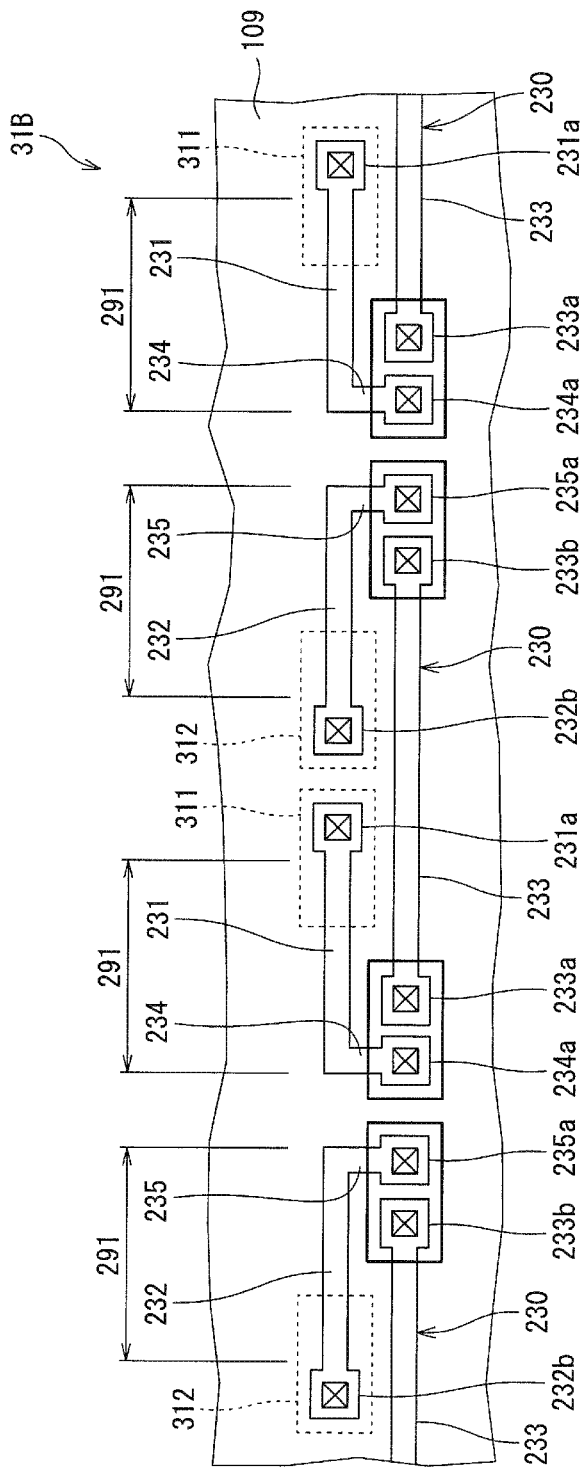
FIG. 13 is a plan view of main components of the thin film resistor shown in FIG. 12, where the depiction of a second thin film resistor unit is omitted.

As shown in FIG. 13, the first thin film resistor unit 230 is configured so as to have a plan view pattern whereby the first thin film resistor unit 230 is formed so as to loop around in a ring shape such that one end thereof faces another end. As shown in FIG. 12, the second thin film resistor unit 220 is configured to have a plan view pattern in which the second thin film resistor unit 220 extends in a straight line or a curve from the one end of one first thin film resistor unit 230 to the other end of another first thin film resistor unit 230, among adjacent first thin film resistor units 230. Also, similar to Embodiment 1, the second thin film resistor unit 220 has a contact section 220a on the one end and a contact section 220b on the other end.

As shown in FIG. 13, the first thin film resistor unit 230 has: a first portion 231 provided with a contact section 231a on the one end thereof, the first portion 231 extending along the lengthwise direction of the second thin film resistor unit 220; and a second portion 232 provided with a contact section 232b formed apart from the contact section 231a so as to face the contact section 231a on the one end, the second portion 232 extending along the lengthwise direction of the second thin film resistor unit 220 away from the first portion 231. The first thin film resistor unit 230 has a third portion 233 that is provided with a contact section 233a on the one end and a contact section 233b on the other end, and that extends from the other end of the first portion 231 to the other end of the second portion 232, and that is arranged so as to be parallel to the first portion 231 and the second portion 232. The first thin film resistor unit 230 has a fourth portion 234 having the one end linked to the other end of the first portion 231, and a contact section 234a on the other end, the fourth portion 234 being drawn from the other end of the first portion 231 towards the third portion 233. The first thin film resistor unit 230 has a fifth portion 235 having one end linked to the other end of the second portion 232, and a contact section 235a on the other end, the fifth portion 235 being drawn from the other end of the second portion 232 towards the third portion 233. As shown in FIGS. 14 and 15, the first portion 231, the second portion 232, the fourth portion 234, and the fifth portion 235 are formed in the first thin film semiconductor layer. As shown in FIG. 15, the third portion 233 is formed in the second thin film semiconductor layer. As a whole, the first thin film resistor unit 230 has the contact section 231a of the first portion 231 on the one end and the contact section 232b of the second portion 232 on the other end.

As shown in FIGS. 12 to 14, the first thin film resistor unit 230 is arranged such that the first portion 231 and the second portion 232 overlap the second thin film resistor unit 220, and overlapping portions 291 are each formed by the first portion 231, the second portion 232, and the second thin film resistor unit 220. The overlapping portions 291 are provided periodically so as to be scattered along the lengthwise direction of the thin film resistor 200B.

As shown in FIGS. 12 and 14, the first thin film resistor unit 230 and the second thin film resistor unit 220 are electrically connected through a first relay wiring line 311 and a second relay wiring line 312 formed in the second metal wiring layer. Specifically, the contact section 231a on the one end of the first thin film resistor unit 230 is electrically and metallurgically connected to one end of the first relay wiring line 311 through a contact hole 260a penetrating the second interlayer insulating film 260 and the first interlayer insulating film 250. Also, the contact section 220a on the one end of the second thin film resistor unit 220 is electrically and metallurgically connected to the other end of the first relay wiring line 311 through a contact hole 260b penetrating the second interlayer insulating film 260.

Additionally, the contact section 232b on the other end of the first thin film resistor unit 230 is electrically and metallurgically connected to the one end of the second relay wiring line 312 through a contact hole 260c penetrating the second interlayer insulating film 260 and the first interlayer insulating film 250. The contact section 220b on the other end of the second thin film resistor unit 220 is electrically and metallurgically connected to the other end of the second relay wiring line 312 through a contact hole 260d penetrating the second interlayer insulating film 260.

As shown in FIGS. 12, 13, and 15, in the first thin film resistor unit 230, the third portion 233, the fourth portion 234, and the fifth portion 235 are electrically connected through a first intermediate wiring line 313 and a second intermediate wiring line 314 formed in the second metal wiring layer. Specifically, the contact section 233a on one end of the third portion 233 is electrically and metallurgically connected to one end of the first intermediate wiring line 313 through a contact hole 260g penetrating the second interlayer insulating film 260. Additionally, the contact section 234a on the other end of the fourth portion 234 is electrically and metallurgically connected to the other end of the first intermediate wiring line 313 through a contact hole 260h penetrating the second interlayer insulating film 260 and the first interlayer insulating film 250.

Also, the contact section 233b on the other end of the third portion 233 is electrically and metallurgically connected to one end of the second intermediate wiring line 314 through a contact hole 260i penetrating the second interlayer insulating film 260. Additionally, the contact section 234a on the other end of the fifth portion 235 is electrically and metallurgically connected to the other end of the second intermediate wiring line 314 through a contact hole 260j penetrating the second interlayer insulating film 260 and the first interlayer insulating film 250.

The contact sections 231a, 232b, 233a, 233b, 234a, and 235a of the first thin film resistor unit 230 are also formed to have a greater width than the intermediate portion between the contact sections in order to mitigate contact defects resulting from mask offset.

Even in the semiconductor device 31B of Embodiment 2 configured in this manner, the thin film resistor 200B, which extends while being folded over such that respective portions of the first thin film resistor unit 230 and the second thin film resistor unit 220 overlap, is provided, and thus, similar to the semiconductor device 31A of Embodiment 1 described above, it is possible to increase resistance of the thin film resistor 200B while mitigating an increase in chip size. Also, it is possible to reduce power consumption while mitigating an increase in chip size. Additionally, it is possible to reduce power consumption while mitigating variation in resistance.

As shown in FIG. 12, in the semiconductor device 31B of Embodiment 2, the first relay wiring line 311, the second relay wiring line 312, the first intermediate wiring line 313, and the second intermediate wiring line 314 are offset in position so as not to be aligned in a row. By offsetting the positions of the first relay wiring line 311, the second relay wiring line 312, the first intermediate wiring line 313, and the second intermediate wiring line 314 in this manner, it is possible to narrow the gap between the first thin film resistor unit 230 and the second thin film resistor unit 220 when viewed from a direction perpendicular to the upper surface of the semiconductor substrate 100, and thus, even when using the first intermediate wiring line 313 and the second intermediate wiring line 314, it is possible to narrow the gap of the spiral.

Modification Example of Embodiment 2

Next, a modification example of the semiconductor device 31B of Embodiment 2 will be described with reference to FIGS. 16 to 18.

As shown in FIGS. 12 to 15, a case was described in which the semiconductor device 31B of Embodiment 2 includes the thin film resistor 200B in which the first thin film resistor unit 230 and the second thin film resistor unit 220 are connected through the first relay wiring line 311 and the second relay wiring line 312, and the third portion 233, the fourth portion 234, and the fifth portion 235 of the first thin film resistor unit 230 are connected through the first intermediate wiring line 313 and the second intermediate wiring line 324. In contrast, as shown in FIGS. 16 to 18, a modification example of the semiconductor device 31B of Embodiment 2 includes a thin film resistor $200B_1$ in which the first thin film resistor unit 230 and the second thin film resistor unit 220 are connected directly without the use of relay wiring lines, and the third portion 233, the fourth portion 234, and the fifth portion 235 of the first thin film resistor unit 230 are connected directly without the use of intermediate wiring lines. Specifically, as shown in FIGS. 16 and 17, the contact section 231a on one end of the first thin film resistor unit 230 is electrically and metallurgically connected directly to the contact section 220a on one end of the second thin film resistor unit 220 through a contact hole 250k penetrating the first interlayer insulating film 250. Additionally, the contact section 232b on the other end of the first thin film resistor unit 230 is electrically and metallurgically connected directly to the contact section 220b on the other end of the second thin film resistor unit 220 through a contact hole 250m penetrating the first interlayer insulating film 250.

Figure 16:
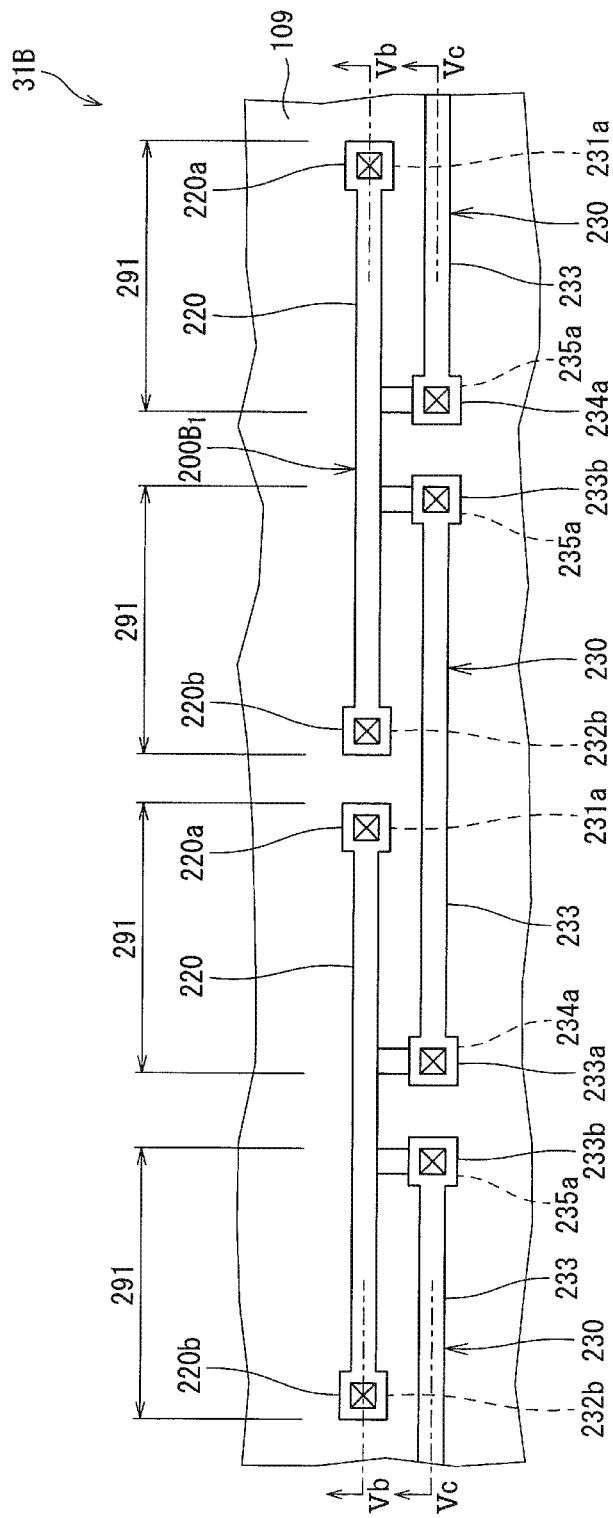
FIG. 16 is a plan view of main components showing a modification example of a semiconductor device of Embodiment 2 of the present invention.
Figure 17:
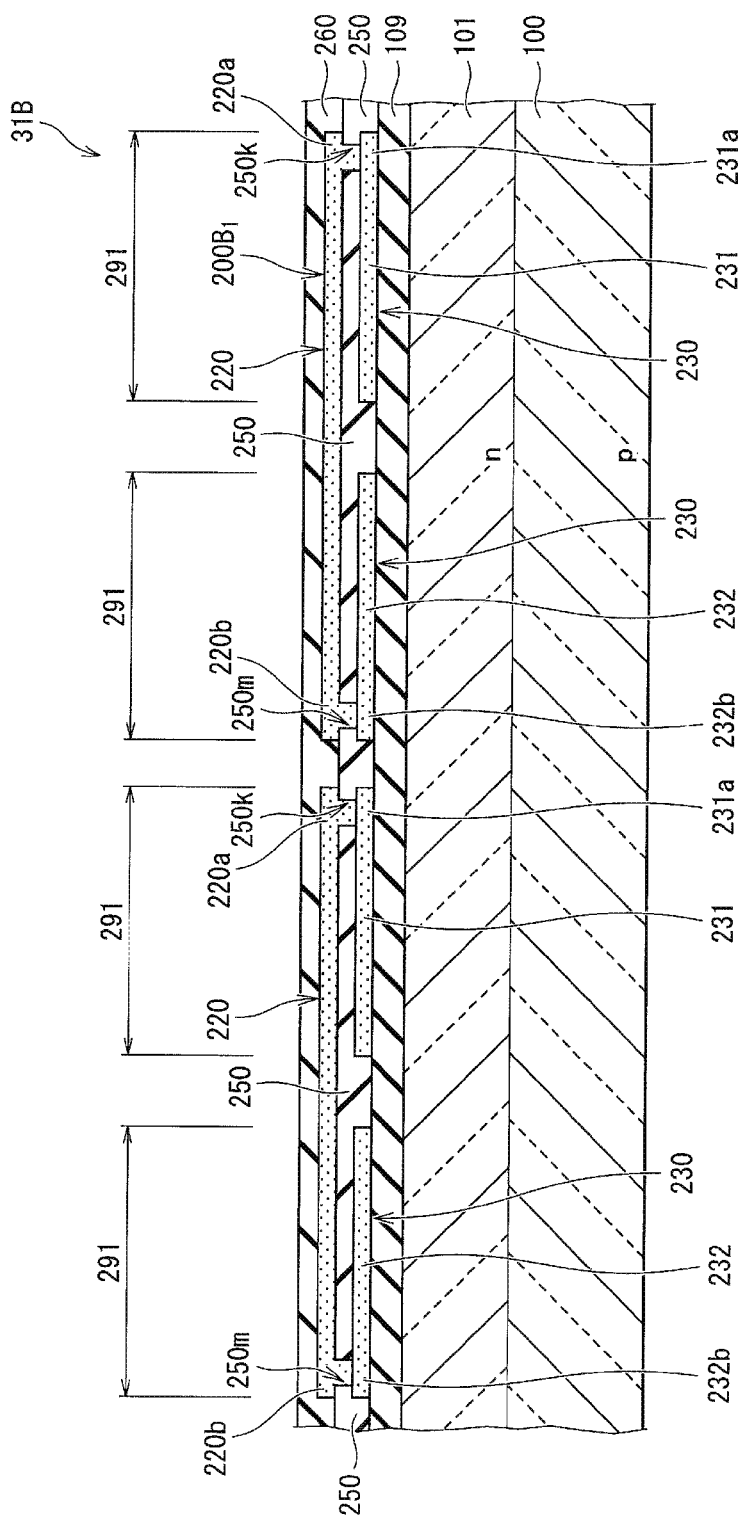
FIG. 17 is a cross-sectional view of main components showing a cross-sectional structure of FIG. 16 along the line Vb-Vb.
Figure 18:
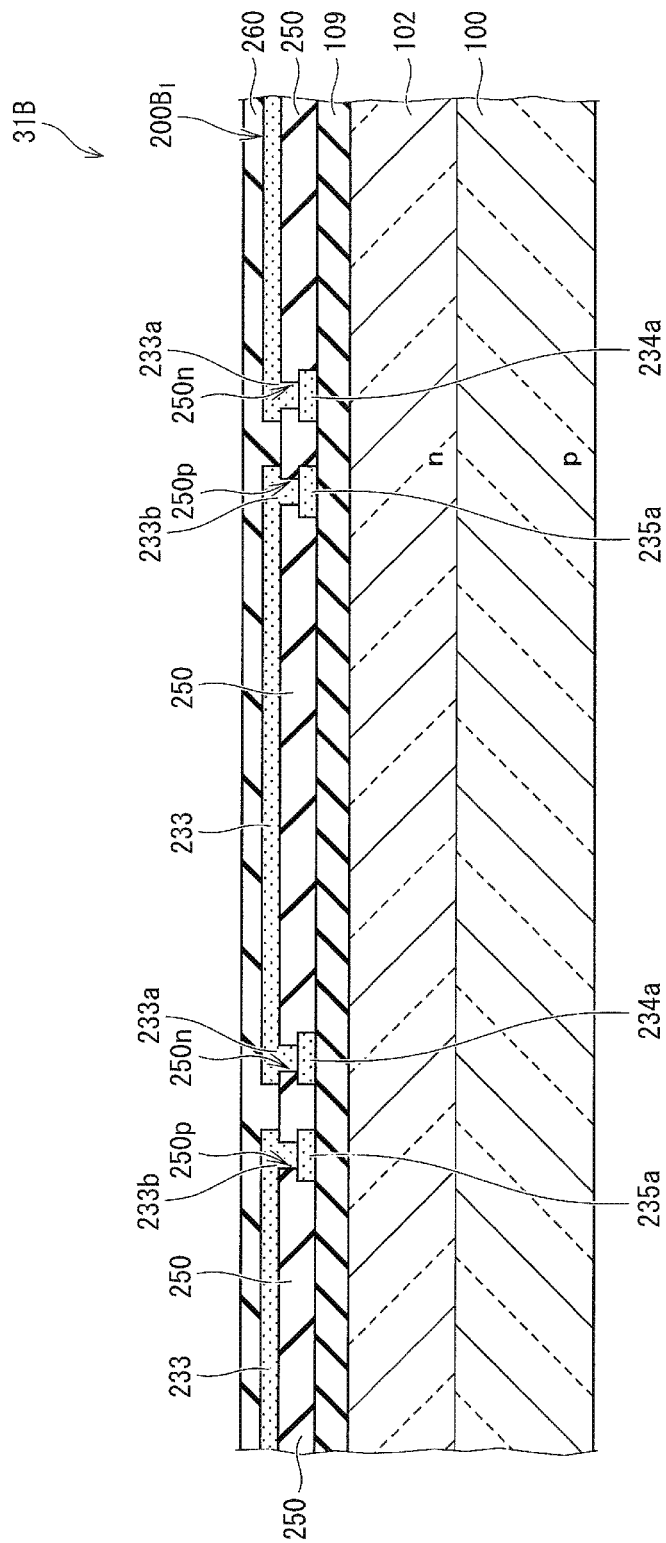
FIG. 18 is a cross-sectional view of main components showing a cross-sectional structure of FIG. 16 along the line Vc-Vc.

Also, as shown in FIGS. 16 and 18, in the first thin film resistor unit 230, a contact section 234a on the other end of the fourth portion 234 is electrically and metallurgically connected directly to one end of the third portion 233 through a contact hole 250n penetrating the first interlayer insulating film 250. Also, the contact section 235a on the other end of the fifth portion 235 is electrically and metallurgically connected directly to the other end of the third portion 233 through a contact hole 250p penetrating the first interlayer insulating film 250.

Even in the modification example of the semiconductor device 31B of Embodiment 2 configured in this manner, the thin film resistor $200B_1$, which extends while being folded over such that respective portions of the first thin film resistor unit 230 and the second thin film resistor unit 220 overlap, is provided, and thus, similar to the semiconductor device 31A of Embodiment 1 described above, it is possible to increase resistance of the thin film resistor $200B_1$ while mitigating an increase in chip size. Also, it is possible to reduce power consumption while mitigating an increase in chip size. Additionally, it is possible to reduce power consumption while mitigating variation in resistance.

In the modification example of the semiconductor device 31B of Embodiment 2, the contact section 231a on the one end of the first thin film resistor unit 230 overlaps the contact section 220a on the one end of the second thin film resistor unit 220, and the contact section 232b on the other end of the first thin film resistor unit 230 overlaps the contact section 220b on the other end of the second thin film resistor unit 220, and the length of the overlapping portions 291 is greater than in the thin film resistor 200A of Embodiment 1. Thus, it is possible to further increase the resistance of the thin film resistor 200B$_1$ while mitigating an increase in chip size.

In Embodiment 2 and the modification example of Embodiment 2 described above, a case was described in which the first portion 231, the second portion 232, the fourth portion 234, and the fifth portion 235 of the first thin film resistor unit 230 are formed in the first thin film semiconductor layer and the third portion 233 of the first thin film resistor unit 230 and the second thin film resistor unit 220 are formed in the second thin film semiconductor layer. However, the present invention is not limited to this configuration, and a configuration may be adopted in which the first portion 231, the second portion 232, the fourth portion 234, and the fifth portion 235 of the first thin film resistor unit 230 are formed in the first thin film semiconductor layer, and the third portion 233 of the first thin film resistor unit 230 and the second thin film resistor unit 220 are formed in the second thin film semiconductor layer.

Embodiment 3

A semiconductor device 31C according to Embodiment 3 of the present invention has a configuration in which two high breakdown voltage field effect transistors constituting the startup element 65 are constituted of n-channel conductive type insulating gate transistors (n-type MOSFETs) instead of the junction type transistors (JFETs 81 and 82 of Embodiment 1). Below, differences between the semiconductor device 31C of Embodiment 3 and the semiconductor device 31A of Embodiment 1 will be described with reference to FIG. 18.

Figure 19:
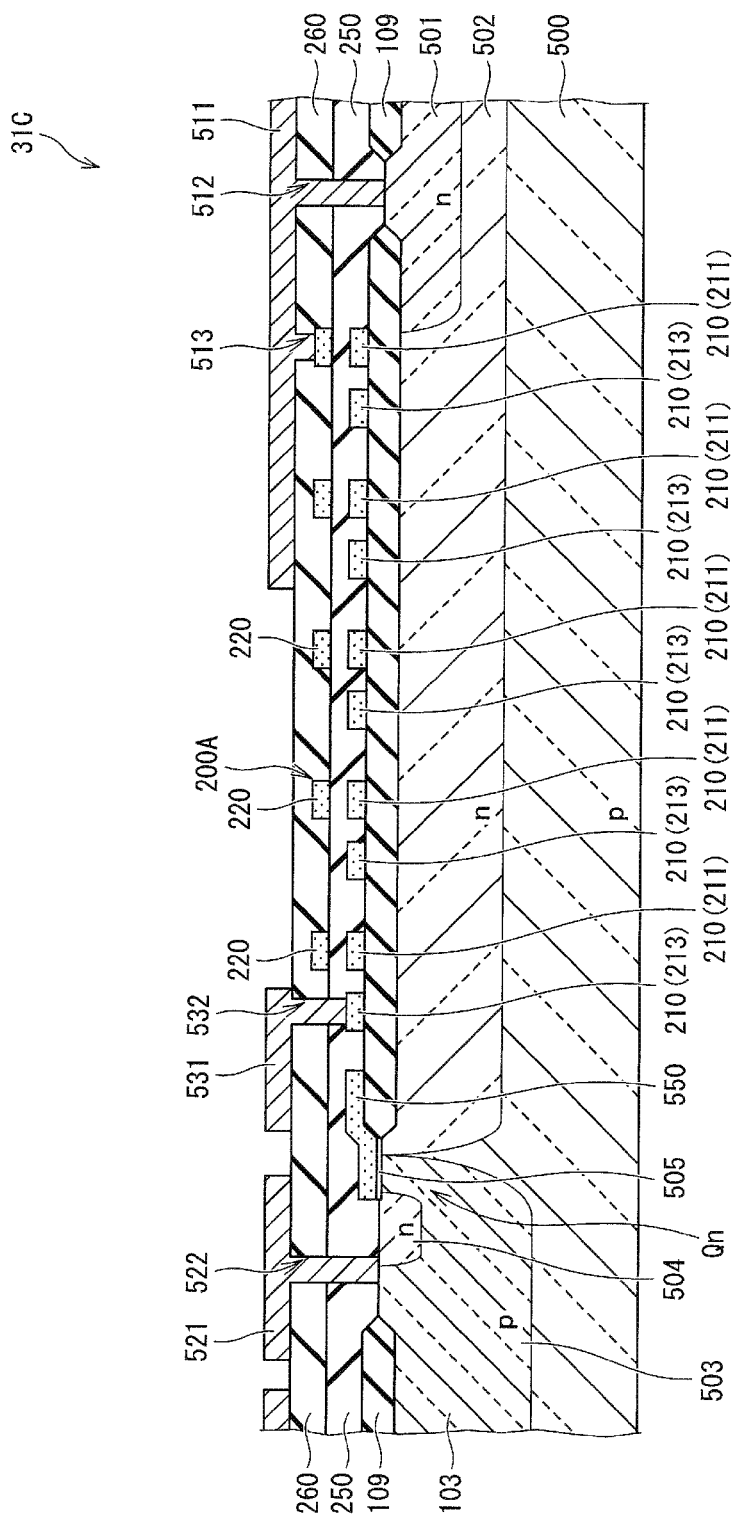
FIG. 19 is a cross-sectional view of main components showing a schematic configuration of a semiconductor device of Embodiment 3 of the present invention.

As shown in FIG. 19, an n-type MOSFET-Qn is configured on a semiconductor substrate 500. As the semiconductor substrate 500, a first conductivity type (p-type) semiconductor substrate made of monocrystalline silicon, for example, is used.

The n-type MOSFET-Qn has a second conductivity type (n-type) first primary electrode region 501 (drain region), a second conductivity type (n-type) drift region 502, a first conductivity type (p-type) base region 503 (channel formation region), a second conductivity type (n-type) second primary electrode region 504 (source region), a gate insulation film 505, and a gate electrode 550.

The drift region 502 is provided over the semiconductor substrate 500. The first primary electrode region 501 is provided over the semiconductor substrate 500 and in the drift region 502. The base region 103 is selectively provided on the semiconductor substrate 500 and to the outside of the drift region 502 and is in contact with the drift region 502. The second primary electrode region 504 is provided over the semiconductor substrate 500 and in the base region 503, and is provided away from the drift region 502. The gate insulation film 505 is provided over the semiconductor substrate 500 and across the drift region 502 and the base region 503. The gate electrode 550 is provided from over the field insulating film 109 to over the gate insulation film 505.

The first primary electrode wiring line 511 is electrically and metallurgically connected to the first primary electrode region 501 through a contact hole 512 penetrating the second interlayer insulating film 260 and the first interlayer insulating film 250. Also, the first primary electrode wiring line 511 is electrically and metallurgically connected to one end of the thin film resistor 200A through a contact hole 513 formed through the second interlayer insulating film 260.

The second primary electrode wiring line 521 is electrically and metallurgically connected to the second primary electrode region 504 and the base region 503 through a contact hole 522 penetrating the second interlayer insulating film 260 and the first interlayer insulating film 250.

Also, the resistor connection wiring line 531 is electrically and metallurgically connected to the other end of the thin film resistor 200A through a contact hole 532 formed through the second interlayer insulating film 260 and the first interlayer insulating film 250.

The thin film resistor 200A is arranged over the breakdown voltage region (drift region 502) of the n-type MOSFET-Qn with the field insulating film 109 therebetween. The thin film resistor 200A has a similar configuration to Embodiment 1 described above.

Even with the semiconductor device 31C of Embodiment 3 configured in this manner, similar effects to those of the semiconductor device 31A of Embodiment 1 described above can be attained.

The present invention was described in detail above on the basis of the embodiments, but the present invention is not limited to the embodiments above, and various modifications can naturally be made thereto within a scope that does not depart from the gist of the present invention.

For example, cases were described above in which the semiconductor devices of Embodiments 1 to 3 had semiconductor substrates made of monocrystalline silicon, but the present invention is not limited thereto, and can be applied to a semiconductor device that uses, for example, a semiconductor substrate made of silicon carbide (SiC) or gallium nitride (GaN), a semiconductor substrate provided with an epitaxial layer, or a semiconductor substrate having a desired SOI structure in which a semiconductor layer is provided over the semiconductor substrate with an insulating layer therebetween.

Also, cases were described in which the semiconductor device of Embodiments 1 to 3 used a doped polysilicon film as the thin film resistor, but the present invention is not limited thereto, and can be applied to a semiconductor device that uses an amorphous film, for example.

As described above, the semiconductor device of the present invention can be designed such that the resistance of the thin film resistor is increased while mitigating an increase in chip size, and is useful as a semiconductor device such as a high breakdown voltage IC that drives switching elements.

It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
   a semiconductor substrate; and
   a thin film resistor formed over an upper surface of the semiconductor substrate, the thin film resistor comprising a plurality of first thin film resistor units and a plurality of second thin film resistor units alternately arranged and connected in series, the first thin film resistor units being physically distinct from the second thin film resistor units, each of the first thin film resistor units having an elongated main portion and end portions that are respectively connected to respective ends of the elongated main portion, each of said end portions extending inwardly alongside and parallel to the elongated main potion to form a U-shape together with the elongated main portion in a plan view, and each of said end portions overlapping with adjacent one of the second thin film resistor units in the plan view and being connected to said adjacent one of the second thin film resistor units at an inner tip of the end portion.

2. The semiconductor device according to claim 1, wherein the first thin film resistor units are arranged to follow a virtual spiral curve in a plan view,
wherein in each of the first thin film resistor units, respective ends of the end portions face each other in a plan view, and
wherein each of the second thin film resistor units bridges the respective end portions of two of the first thin film resistor units that are adjacent to the second thin film resistor unit.

3. The semiconductor device according to claim 2, wherein the first thin film resistor units and the second thin film resistor units are made of thin film semiconductor layers that are respectively formed in different layers.

4. The semiconductor device according to claim 3, wherein the first thin film resistor units and the second thin film resistor units are connected to each other through relay wiring lines.

5. The semiconductor device according to claim 3, wherein the first thin film resistor units and the second thin film resistor units are directly connected through respective contact holes formed in an insulating layer that is interposed between said different layers.

6. The semiconductor device according to claim 1, wherein the main portion of each of the first thin film resistor units is formed in a same layer as a layer in which the second thin film resistor units are formed, and the end portions of the first thin film resistor units are formed in a layer different from said layer in which the main portions of the first thin film resistor units and the second thin film resistor units are formed.

7. The semiconductor device according to claim 6, wherein the end portions of each of the first thin film resistor units are connected to two of the second thin film resistor units that are adjacent to the first thin film resistor unit through relay wiring lines, and
wherein in each of the first thin film resistor units, the respective end portions thereof are connected to the main portion thereof through respective intermediate wiring lines.

8. The semiconductor device according to claim 6, wherein the end portions of each of the first thin film resistor units are directly connected to two of the second thin film resistor units that are adjacent to the first thin film resistor unit through respective contact holes formed in an insulating layer, and
wherein in each of the first thin film resistor units, the respective end portions thereof are directly connected to the main portion thereof through respective contact holes formed in said insulating layer.

9. The semiconductor device according to claim 8, further comprising:
a first primary electrode region provided over the semiconductor substrate;
a second primary electrode region provided over the semiconductor substrate and apart from the first primary electrode region;
a drift region provided over the semiconductor substrate and between the first primary electrode region and the second primary electrode region so as to contact the first primary electrode region and the second primary electrode region; and
an insulating film provided over the upper surface of the semiconductor substrate,
wherein the thin film resistor is disposed on the insulating film in the drift region and the first primary electrode region.

* * * * *